United States Patent
Um et al.

(10) Patent No.: US 12,120,931 B2
(45) Date of Patent: Oct. 15, 2024

(54) DISPLAY APPARATUS

(71) Applicant: Samsung Display Co., Ltd., Yongin-si (KR)

(72) Inventors: Nuree Um, Yongin-si (KR); Mihae Kim, Yongin-si (KR); Minjeong Kim, Yongin-si (KR); Hyungjun Park, Yongin-si (KR); Junyong An, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 46 days.

(21) Appl. No.: 17/228,400

(22) Filed: Apr. 12, 2021

(65) Prior Publication Data

US 2021/0399078 A1    Dec. 23, 2021

(30) Foreign Application Priority Data

Jun. 18, 2020    (KR) ........................ 10-2020-0074445

(51) Int. Cl.
*H10K 59/131* (2023.01)
*G09G 3/3258* (2016.01)
(Continued)

(52) U.S. Cl.
CPC ......... *H10K 59/131* (2023.02); *G09G 3/3258* (2013.01); *H01L 27/124* (2013.01);
(Continued)

(58) Field of Classification Search
CPC .............. H01L 27/3262; H01L 27/124; H01L 27/3276; H01L 27/3265; H01L 27/1225;
(Continued)

(56) References Cited

U.S. PATENT DOCUMENTS 10,622,436 B2    4/2020 Park et al.
2009/0243977 A1*   10/2009 Chung ................. G09G 3/3233
                                                345/76
(Continued)

FOREIGN PATENT DOCUMENTS

KR    10-2015-0040152 A    4/2015
KR    10-2018-0003656 A    1/2018
(Continued)

*Primary Examiner* — Shaheda A Abdin
(74) *Attorney, Agent, or Firm* — Lewis Roca Rothgerber Christie LLP

(57) ABSTRACT

A display apparatus includes: a first pixel circuit on the substrate and including a first driving thin-film transistor and a first storage capacitor electrically connected to the first driving thin-film transistor; a second pixel circuit adjacent to the first pixel circuit and including a second driving thin-film transistor and a second storage capacitor electrically connected to the second driving thin-film transistor; a first initialization voltage line electrically connected to the first pixel circuit and the second pixel circuit; a second initialization voltage line electrically connected to the first initialization voltage line; and a driving voltage line between the first pixel circuit and the second pixel circuit, wherein a channel area of the first driving thin-film transistor or a channel area of the second driving thin-film transistor is between the second initialization voltage line and the driving voltage line.

20 Claims, 18 Drawing Sheets

(51) Int. Cl.
  *H01L 27/12*         (2006.01)
  *H10K 59/121*        (2023.01)
(52) U.S. Cl.
  CPC ..... *H10K 59/1213* (2023.02); *H10K 59/1216* (2023.02); *G09G 2300/0426* (2013.01)
(58) Field of Classification Search
  CPC .............. H01L 27/1255; G09G 3/3233; G09G 2300/0861; G09G 2300/0819; G09G 2300/0426; G09G 2320/0214
  See application file for complete search history.

(56)         References Cited

U.S. PATENT DOCUMENTS

| 2015/0015468 | A1* | 1/2015  | Ko   | G09G 3/3233 |
|              |     |         |      | 345/82      |
| 2016/0284267 | A1* | 9/2016  | Gil  | H01L 27/124 |
| 2017/0323598 | A1* | 11/2017 | Park | H10K 50/00  |
| 2019/0130835 | A1* | 5/2019  | Ka   | H01L 51/5206|

FOREIGN PATENT DOCUMENTS

| KR | 10-2019-0056465 A | 5/2019  |
| KR |    10-2016073 B1  | 10/2019 |

* cited by examiner

DISPLAY APPARATUS

CROSS-REFERENCE TO RELATED APPLICATION

The present application claims priority to and the benefit of Korean Patent Application No. 10-2020-0074445, filed on Jun. 18, 2020, in the Korean Intellectual Property Office, the disclosure of which is incorporated by reference herein in its entirety.

BACKGROUND

1. Field

Aspects of one or more embodiments relate to a display apparatus.

2. Description of Related Art

Among display apparatuses, organic light-emitting display apparatuses have many benefits, such as a relatively wide viewing angle, relatively good contrast and a relatively high response rate, and thus, organic light-emitting display apparatuses have drawn attention as a next-generation display apparatus.

Generally, organic light-emitting display apparatuses include a thin-film transistor and organic light-emitting devices on a substrate, wherein the organic light-emitting devices emit light. The organic light-emitting display apparatus may be used as a display device for relatively small-sized products such as cellular phones, etc. or a display device of a large-sized product such as a television, etc.

The organic light-emitting display apparatus includes a thin-film transistor, a capacitor, etc., which enable operation of the organic light-emitting display apparatus. The thin-film transistor may include a semiconductor layer including a channel area, a source area, and a drain area, and a gate electrode electrically insulated from the semiconductor layer via a gate insulating layer.

The above information disclosed in this Background section is only for enhancement of understanding of the background and therefore the information discussed in this Background section does not necessarily constitute prior art.

SUMMARY

Aspects of one or more example embodiments relate to a display apparatus, in which a brightness difference, which may occur due to voltage lines, for example, initialization voltage lines, is improved. However, this characteristic is an example and the scope of embodiments according to the present disclosure is not limited thereto.

Additional aspects will be set forth in part in the description which follows and, in part, will be apparent from the description, or may be learned by practice of the presented embodiments of the disclosure.

According to one or more example embodiments, a display apparatus includes a substrate, a first pixel circuit on the substrate and including a first driving thin-film transistor and a first storage capacitor electrically connected to the first driving thin-film transistor, a second pixel circuit adjacent to the first pixel circuit and including a second driving thin-film transistor and a second storage capacitor electrically connected to the second driving thin-film transistor, a first initialization voltage line electrically connected to the first pixel circuit and the second pixel circuit and extending in a first direction, a second initialization voltage line electrically connected to the first initialization voltage line and extending in a second direction crossing the first direction, and a driving voltage line extending in the second direction between the first pixel circuit and the second pixel circuit, wherein a channel area of the first driving thin-film transistor or a channel area of the second driving thin-film transistor is between the second initialization voltage line and the driving voltage line.

According to some example embodiments, the first pixel circuit may include a first operation control thin-film transistor electrically connected to the driving voltage line, the second pixel circuit may include a second operation control thin-film transistor electrically connected to the driving voltage line, and the first operation control thin-film transistor and the second operation control thin-film transistor may be asymmetric with respect to a virtual axis crossing between the first pixel circuit and the second pixel circuit.

According to some example embodiments, a semiconductor layer of the first operation control thin-film transistor may be electrically connected to the driving voltage line through a first connection electrode.

According to some example embodiments, the first connection electrode may include a $1\text{-}1^{st}$ connection electrode corresponding to a portion of any one of electrodes of the first storage capacitor and contacting the driving voltage line and a $1\text{-}2^{nd}$ connection electrode contacting the $1\text{-}1^{st}$ connection electrode and the semiconductor layer of the first operation control thin-film transistor.

According to some example embodiments, the first pixel circuit may include a first compensation thin-film transistor electrically connected to the first driving thin-film transistor, and a portion of a semiconductor layer of the first compensation thin-film transistor may overlap a shield electrode electrically connected to the driving voltage line.

According to some example embodiments, the second pixel circuit may include a second compensation thin-film transistor electrically connected to the second driving thin-film transistor, and a portion of a semiconductor layer of the second compensation thin-film transistor may overlap a shield electrode electrically connected to the second initialization voltage line.

According to some example embodiments, the second initialization voltage line may be on the same layer as the driving voltage line.

According to some example embodiments, the second initialization voltage line may be on a layer above the first initialization voltage line.

According to some example embodiments, the second initialization voltage line may be electrically connected to the first initialization voltage line through a second connection electrode being integral with the second initialization voltage line.

According to some example embodiments, the first pixel circuit may include a first initialization thin-film transistor electrically connected to the first initialization voltage line, and the second connection electrode may include a $2\text{-}1^{st}$ connection electrode overlapping a portion of the first initialization voltage line and electrically connecting the first initialization voltage line with the second initialization voltage line and a $2\text{-}2^{nd}$ connection electrode extending from the $2\text{-}1^{st}$ connection electrode and electrically connecting the first initialization voltage line with a semiconductor layer of the first initialization thin-film transistor.

According to one or more example embodiments, a display apparatus includes a substrate, a first pixel circuit on the substrate and including a first driving thin-film transistor and a first storage capacitor electrically connected to the first driving thin-film transistor, a second pixel circuit adjacent to the first pixel circuit and including a second driving thin-film transistor and a second storage capacitor electrically connected to the second driving thin-film transistor, a first initialization voltage line electrically connected to the first pixel circuit and the second pixel circuit and extending in a first direction, a second initialization voltage line electrically connected to the first initialization voltage line and extending in a second direction crossing the first direction, and a driving voltage line extending in the second direction between the first pixel circuit and the second pixel circuit, wherein the second initialization voltage line overlaps the driving voltage line.

According to some example embodiments, the first pixel circuit and the second pixel circuit may be symmetric with respect to a virtual axis crossing between the first pixel circuit and the second pixel circuit.

According to some example embodiments, the first pixel circuit may include a first compensation thin-film transistor electrically connected to the first driving thin-film transistor and the second pixel circuit may include a second compensation thin-film transistor electrically connected to the second driving thin-film transistor, and a portion of a semiconductor layer of the first compensation thin-film transistor and a portion of a semiconductor layer of the second compensation thin-film transistor may overlap a shield electrode electrically connected to the driving voltage line.

According to some example embodiments, the driving voltage line may be on a layer above the first initialization voltage line, and the second initialization voltage line may be on a layer above the driving voltage line.

According to some example embodiments, the first initialization voltage line and the second initialization voltage line may be electrically connected to each other through a third connection electrode on a layer between the first initialization voltage line and the second initialization voltage line.

According to one or more example embodiments, a display apparatus includes a substrate including a hole, a first pixel circuit and a second pixel circuit adjacent to each other around the hole, a first initialization voltage line electrically connected to the first pixel circuit and the second pixel circuit and extending in a first direction, a second initialization voltage line electrically connected to the first initialization voltage line and extending in a second direction crossing the first direction, and a driving voltage line extending in the second direction between the first pixel circuit and the second pixel circuit, wherein at least one of the first initialization voltage line, the second initialization voltage line, or the driving voltage line is disconnected around the hole.

According to some example embodiments, the first pixel circuit may include a first operation control thin-film transistor electrically connected to the driving voltage line, the second pixel circuit may include a second operation control thin-film transistor electrically connected to the driving voltage line, and the first operation control thin-film transistor and the second operation control thin-film transistor may be asymmetric with respect to the driving voltage line.

According to some example embodiments, a semiconductor layer of the first operation control thin-film transistor may be electrically connected to the driving voltage line through a first connection electrode, and the first connection electrode may include a 1-1$^{st}$ connection electrode corresponding to a portion of any one of electrodes of a first storage capacitor in the first pixel circuit and contacting the driving voltage line and a 1-2$^{nd}$ connection electrode contacting the 1-1$^{st}$ connection electrode and the semiconductor layer of the first operation control thin-film transistor.

According to some example embodiments, the first pixel circuit and the second pixel circuit may be symmetric with respect to the driving voltage line.

According to some example embodiments, the driving voltage line may be on a layer above the first initialization voltage line and the second initialization voltage line may be on a layer above the driving voltage line.

According to some example embodiments, the first initialization voltage line and the second initialization voltage line may be electrically connected to each other through a third connection electrode located on a layer between the first initialization voltage line and the second initialization voltage line.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
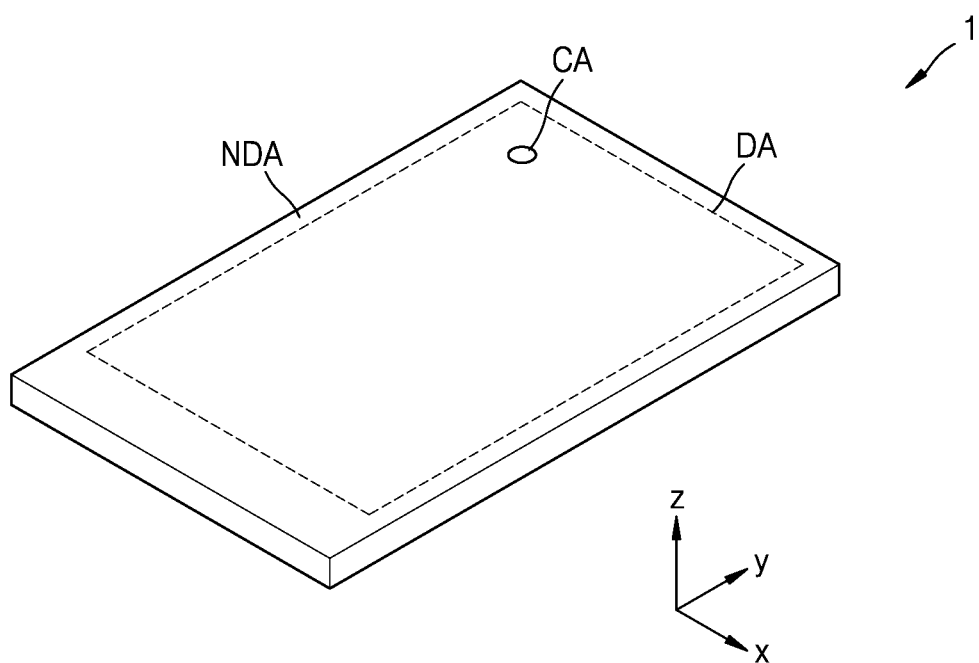
FIG. 1 is a schematic perspective view of a display apparatus according to some example embodiments.

Reference will now be made in more detail to aspects of some example embodiments, which are illustrated in the accompanying drawings, wherein like reference numerals refer to like elements throughout. In this regard, embodiments according to the present disclosure may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

While embodiments according to the disclosure are capable of various modifications and alternative forms, embodiments thereof are shown by way of example in the drawings and will herein be described in more detail. Effects and characteristics of the disclosure, and realizing methods thereof will become apparent by referring to the drawings and embodiments described in more detail below. However, embodiments according to the present disclosure are not limited to the example embodiments described hereinafter and may be realized in various forms.

Hereinafter, aspects of some example embodiments of the disclosure will be described in more detail by referring to the accompanying drawings. In descriptions with reference to the drawings, the same reference numerals are given to components that are the same or substantially the same and descriptions will not be repeated.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. For example, sizes and thicknesses of the elements in the drawings are randomly indicated for convenience of explanation, and thus, the disclosure is not necessarily limited to the illustrations of the drawings.

When a certain embodiment may be implemented differently, a specific process order may be performed differently from the described order. For example, two consecutively described processes may be performed substantially at the same time or performed in an order opposite to the described order.

In this specification, the expression "A and/or B" may indicate A, B, or A and B. Also, the expression "at least one of A and B" may indicate A, B, or A and B.

In the embodiments hereinafter, it will be understood that when an element, an area, or a layer is referred to as being connected to another element, area, or layer, it can be directly and/or indirectly connected to the other element, area, or layer. For example, it will be understood in this specification that when an element, an area, or a layer is referred to as being in contact with or being electrically connected to another element, area, or layer, it can be directly and/or indirectly in contact with or electrically connected to the other element, area, or layer.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Hereinafter, aspects of some example embodiments will be described in more detail with reference to the accompanying drawings.

FIG. 1 is a schematic perspective view of a display apparatus 1 according to some example embodiments.

As illustrated in FIG. 1, the display apparatus 1 according to some example embodiments may include a display area DA in which light is emitted and a non-display area NDA in which light is not emitted. The non-display area NDA may entirely surround the display area DA. A substrate may include a first area corresponding to the display area DA and a second area corresponding to the non-display area NDA, wherein in the first area of the substrate, pixel circuits to be described below and light-emitting diodes respectively electrically connected to the pixel circuits may be arranged.

FIG. 1 illustrates the display apparatus 1 including the display area DA having a square shape. However, the display area DA may have arbitrary shapes, such as a circular shape, an oval shape, or a polygonal shape.

In some embodiments, the display apparatus 1 may include a component area CA. The component area CA may be arranged inside the display area DA and may be entirely surrounded by the display area DA. Components may be arranged in the component area CA, and the display apparatus 1 may perform various functions by using the components.

The components may include electronic elements using light and/or sound. The electronic elements may include a sensor configured to measure a distance, such as a proximity sensor, a sensor configured to recognize a part (for example, a fingerprint, an iris, a face, etc.) of a body of a user, a small lamp configured to output light, an image sensor (for example, a camera) configured to capture an image, and the like. The electronic elements using light may use light of various wavelength ranges, such as visible rays, infrared rays, ultraviolet rays, etc. The electronic elements using sound may use ultrasonic sound waves or sound of other frequency bands.

The light and/or the sound of the electronic elements may pass or transmit through the component area CA, and accordingly, the component area CA may be a transmission area through which light and/or sound may transmit.

Hereinafter, an organic light-emitting display apparatus including an organic light-emitting diode will be described as an example of the display apparatus 1 according to some example embodiments. However, the display apparatus 1 according to embodiments of the present disclosure is not limited thereto. A light-emitting diode of the display apparatus 1 may include an inorganic light-emitting diode including an inorganic material. The inorganic light-emitting diode may include a PN junction diode including inorganic semiconductor materials. When a voltage is applied to the PN junction diode in a normal direction, holes and electrons may be injected into the PN junction diode, and energy generated by recombination of holes and the electrons may be converted into light energy to emit a certain color of light. The inorganic light-emitting diode described above may have a width of several to hundreds of micrometers, and in some embodiments, the inorganic light-emitting diode may be referred to as a micro light-emitting diode.

Figure 2:
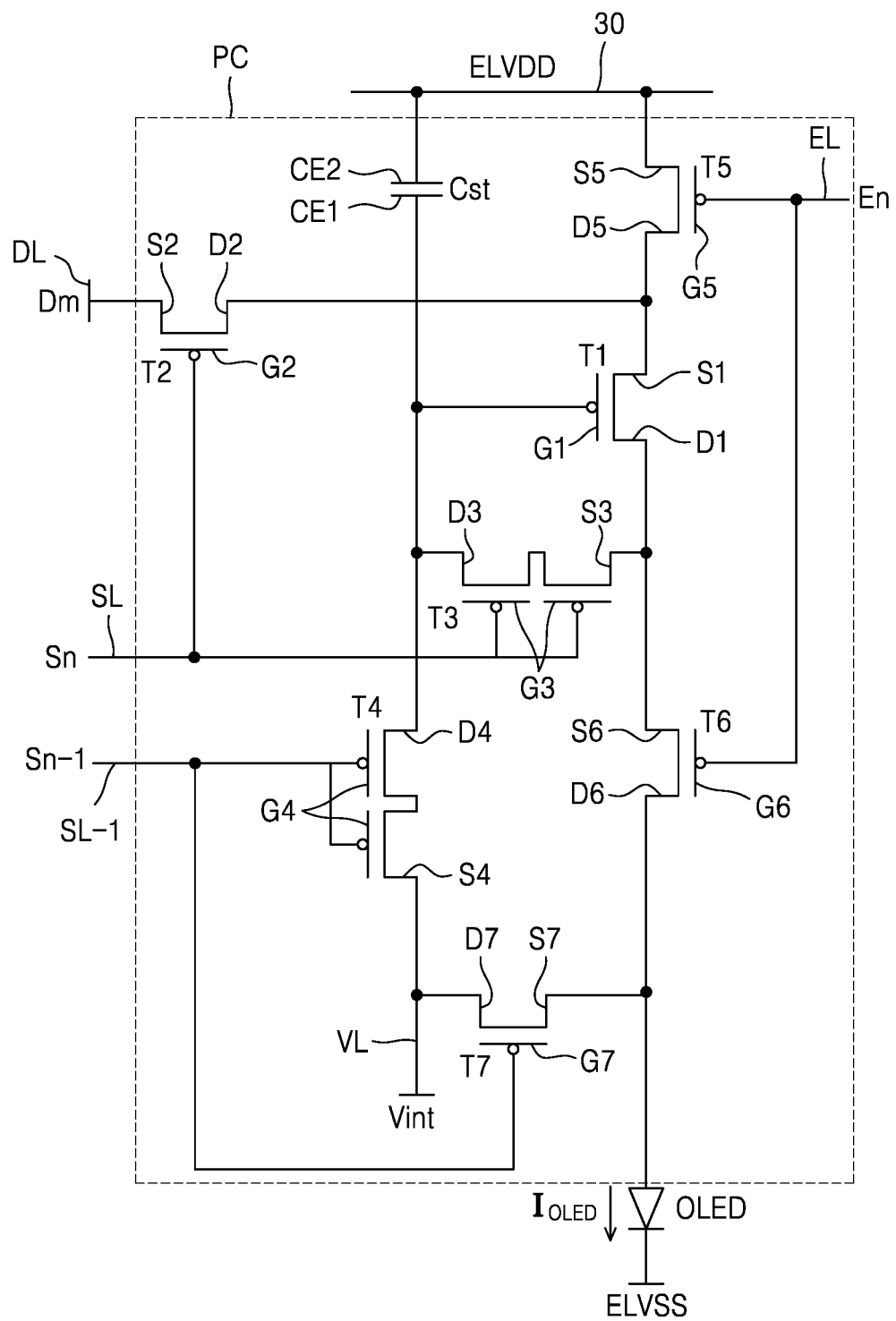
FIG. 2 is a schematic equivalent circuit diagram of a pixel circuit electrically connected to any one light-emitting diode of a display apparatus according to some example embodiments.

FIG. 2 is a schematic equivalent circuit diagram of a pixel circuit PC electrically connected to any one light-emitting diode of the display apparatus 1 according to some example embodiments.

As illustrated in FIG. 2, the light-emitting diode may include an organic light-emitting diode OLED, and the organic light-emitting diode OLED may be electrically connected to the pixel circuit PC including thin-film transistors and a capacitor(s).

According to some example embodiments, the pixel circuit PC may include a plurality of thin-film transistors T1 through T7 and a storage capacitor Cst. The thin-film transistors T1 through T7 and the storage capacitor Cst may be connected to signal lines SL, SL-1, EL, and DL, an initialization voltage line VL, and a driving voltage line 30. At least one of the signal lines SL, SL-1, EL, DL, the initialization voltage line VL, and/or the driving voltage line 30 may be shared by neighboring pixel circuits PC.

Although, FIG. 2 illustrates that the thin-film transistors T1 through T7 are realized as p-channel MOS (PMOS) field-effect transistors (FETs) (pMOSFETs), a person having ordinary skill in the art would recognize that at least one or more of the thin-film transistors T1 through T7 may be realized as n-channel MOS (nMOS) FETs (nMOSFETs) according to some example embodiments. For example, from among the thin-film transistors T1 through T7, a driving thin-film transistor T1, a switching thin-film transistor T2, an operation control thin-film transistor T5, and an emission control thin-film transistor T6 may be realized as pMOSFETs, and a compensation thin-film transistor T3, an initialization thin-film transistor T4, and a reset thin-film transistor T7 may be realized as nMOSFETs. Embodiments according to the present invention are not limited thereto, and according to some example embodiments, the number of transistors and the type of transistor may vary (e.g., there may be additional transistors or other electronic components, or fewer transistors or other components) without departing from the spirit and scope of embodiments according to the present disclosure.

A driving gate electrode G1 of the driving thin-film transistor T1 may be connected to a lower electrode CE1 of the storage capacitor Cst, a driving source electrode S1 of the driving thin-film transistor T1 may be connected to the driving voltage line 30 through the operation control thin-film transistor T5, and a driving drain electrode D1 of the driving thin-film transistor T1 may be electrically connected to a pixel electrode of the organic light-emitting diode OLED through the emission control thin-film transistor T6. The driving thin-film transistor T1 may receive a data signal Dm according to a switching operation of the switching thin-film transistor T2 and supply a driving current IDLED to the organic light-emitting diode OLED.

A switching gate electrode G2 of the switching thin-film transistor T2 may be connected to a scan line SL, a switching source electrode S2 of the switching thin-film transistor T2 may be connected to a data line DL, and a switching drain electrode D2 of the switching thin-film transistor T2 may be connected to the diving source electrode S1 of the driving thin-film transistor T1 while being connected to the driving voltage line 30 through the operation control thin-film transistor T5. The switching thin-film transistor T2 may be turned on in response to a scan signal Sn transmitted through the scan line SL and may perform a switching operation of transmitting a data signal Dm transmitted through the data line DL to the driving source electrode S1 of the driving thin-film transistor T1.

A compensation gate electrode G3 of the compensation thin-film transistor T3 may be connected to the scan line SL, a compensation source electrode S3 of the compensation thin-film transistor T3 may be connected to the driving drain electrode D1 of the driving thin-film transistor T1 while being connected to the pixel electrode of the organic light-emitting diode OLED through the emission control thin-film transistor T6, and a compensation drain electrode D3 of the compensation thin-film transistor T3 may be connected to the lower electrode CE1 of the storage capacitor Cst, an initialization drain electrode D4 of the initialization thin-film transistor T4, and the driving gate electrode G1 of the driving thin-film transistor T1. The compensation thin-film transistor T3 may be turned on in response to a scan signal Sn received through the scan line SL and may electrically connect the driving gate electrode G1 and the driving drain electrode D1 of the driving thin-film transistor T1 to diode-connect the driving thin-film transistor T1.

An initialization gate electrode G4 of the initialization thin-film transistor T4 may be connected to a previous scan line SL-1, an initialization source electrode S4 of the initialization thin-film transistor T4 may be connected to the initialization voltage line VL, and the initialization drain electrode D4 of the initialization thin-film transistor T4 may be connected to the lower electrode CE1 of the storage capacitor Cst, the compensation drain electrode D3 of the compensation thin-film transistor T3, and the driving gate electrode G1 of the driving thin-film transistor T1. The initialization thin-film transistor T4 may be turned on in response to a previous scan signal Sn-1 received through the previous scan line SL-1 and may perform an initialization operation of initializing a voltage of the driving gate electrode G1 of the driving thin-film transistor T1 by transmitting an initialization voltage Vint to the driving gate electrode G1 of the driving thin-film transistor T1.

An operation control gate electrode G5 of the operation control thin-film transistor T5 may be connected to an emission control line EL, an operation control source electrode S5 of the operation control thin-film transistor T5 may be connected to the driving voltage line 30, and an operation control drain electrode D5 of the operation control thin-film transistor T5 may be connected to the driving source electrode S1 of the driving thin-film transistor T1 and the switching drain electrode D2 of the switching thin-film transistor T2.

An emission control gate electrode G6 of the emission control thin-film transistor T6 may be connected to the emission control line EL, an emission control source electrode S6 of the emission control thin-film transistor T6 may be connected to the driving drain electrode D1 of the driving thin-film transistor T1 and the compensation source electrode S3 of the compensation thin-film transistor T3, and an emission control drain electrode D6 of the emission control thin-film transistor T6 may be electrically connected to a reset source electrode S7 of the reset thin-film transistor T7 and the pixel electrode of the organic light-emitting diode OLED.

The operation control thin-film transistor T5 and the emission control thin-film transistor T6 may be simultaneously turned on in response to an emission control signal En received through the emission control line EL so that a driving voltage ELVDD may be transmitted to the organic light-emitting diode OLED and a driving current IOLED may flow in the organic light-emitting diode OLED.

A reset gate electrode G7 of the reset thin-film transistor T7 may be connected to the previous scan line SL-1, the reset source electrode S7 of the reset thin-film transistor T7 may be connected to the emission control drain electrode D6 of the emission control thin-film transistor T6 and the pixel electrode of the organic light-emitting diode OLED, and a reset drain electrode D7 of the reset thin-film transistor T7 may be connected to the initialization source electrode S4 of the initialization thin-film transistor T4 and the initialization voltage line VL.

The scan line SL and the previous scan line SL-1 may be electrically connected with each other, and thus, the same scan signal Sn may be applied to the scan line SL and the previous scan line SL-1. Thus, the reset thin-film transistor T7 may be turned on in response to a scan signal Sn transmitted through the previous scan line SL-1 and may perform an operation of initializing the pixel electrode of the organic light-emitting diode OLED.

FIG. 2 illustrates that the compensation thin-film transistor T3 and the initialization thin-film transistor T4 have a dual gate electrode. However, according to some example embodiments, the compensation thin-film transistor T3 and the initialization thin-film transistor T4 may have a single gate electrode.

The storage capacitor Cst may include the lower electrode CE1 and an upper electrode CE2. The lower electrode CE1 of the storage capacitor Cst may be connected to the driving gate electrode G1 of the driving thin-film transistor T1 and the upper electrode CE2 of the storage capacitor Cst may be connected to the driving voltage line 30. The storage capacitor Cst may store and retain a voltage corresponding to a difference between the voltage of the driving voltage line 30 and the voltage of the driving gate electrode G1 of the driving thin-film transistor T1, thereby retaining a voltage applied to the driving gate electrode G1 of the driving thin-film transistor T1.

The organic light-emitting diode OLED may include a pixel electrode, an opposite electrode, and an intermediate layer between the pixel electrode and the opposite electrode, the intermediate layer including an emission layer. A common voltage ELVSS may be applied to the opposite electrode, which is integrally formed throughout a plurality of pixels. The organic light-emitting diode OLED may emit light by receiving a driving current IOLED from the driving thin-film transistor T1 so that the display apparatus 1 may display an image. For reference, the opposite electrode may extend to the outside of the display area DA to be connected to an electrode power line, and an electrode voltage ELVSS may be applied to the electrode power line.

The signal lines SL, SL-1, EL, and DL may include the scan line SL transmitting the scan signal Sn, the previous scan line SL-1 transmitting the previous scan signal Sn-1 to the initialization thin-film transistor T4 and transmitting the scan signal Sn to the reset thin-film transistor T7, the emission control line EL transmitting the emission control signal En to the operation control thin-film transistor T5 and the emission control thin-film transistor T6, and the data line DL crossing the scan line SL and transmitting the data signal Dm. The driving voltage line 30 may transmit the driving voltage ELVDD to the driving thin-film transistor T1 and the initialization voltage line VL may transmit the initialization voltage Vint to the initialization thin-film transistor T4 and the reset thin-film transistor T7.

Figure 10:
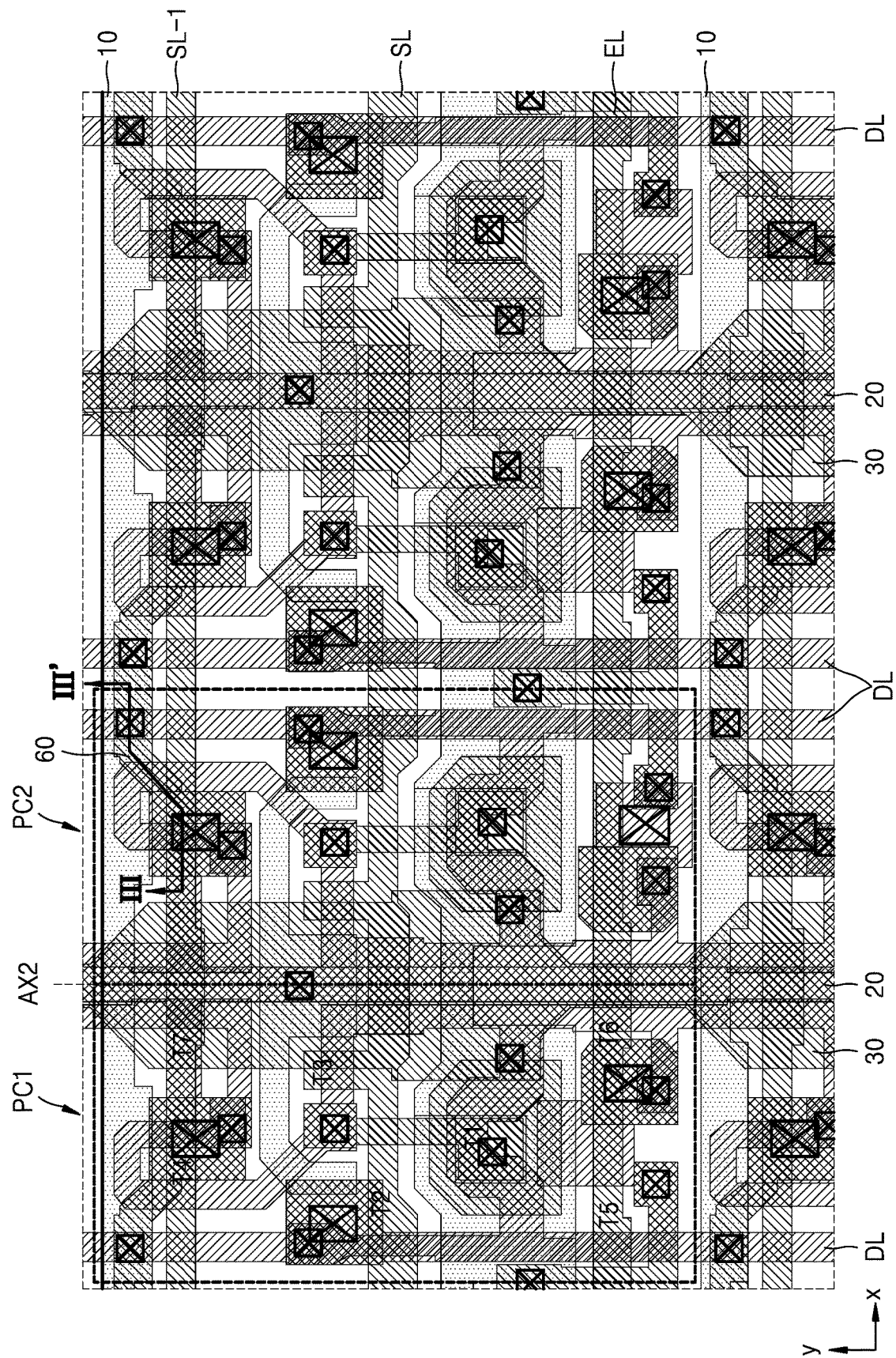
FIG. 10 is a plan view of pixel circuits arranged in a display area of a display apparatus according to some example embodiments.

FIG. 2 illustrates the case where each of pixel circuits PCs includes the signal lines SL, SL-1, EL, and DL, the initialization voltage line VL, and the driving voltage line 30. However, the disclosure is not limited thereto. According to some example embodiments, at least one of the signal lines SL, SL-1, EL, DL, the initialization voltage line VL, and/or the driving voltage line 30 may be shared by neighboring pixel circuits PCs. For example, as illustrated in FIGS. 3 and 10 to be described below, the driving voltage line 30 may be shared by neighboring pixel circuits PC, and as illustrated in FIG. 10, at least a portion of the initialization voltage line VL may be shared by neighboring pixel circuits PCs.

Figure 3:
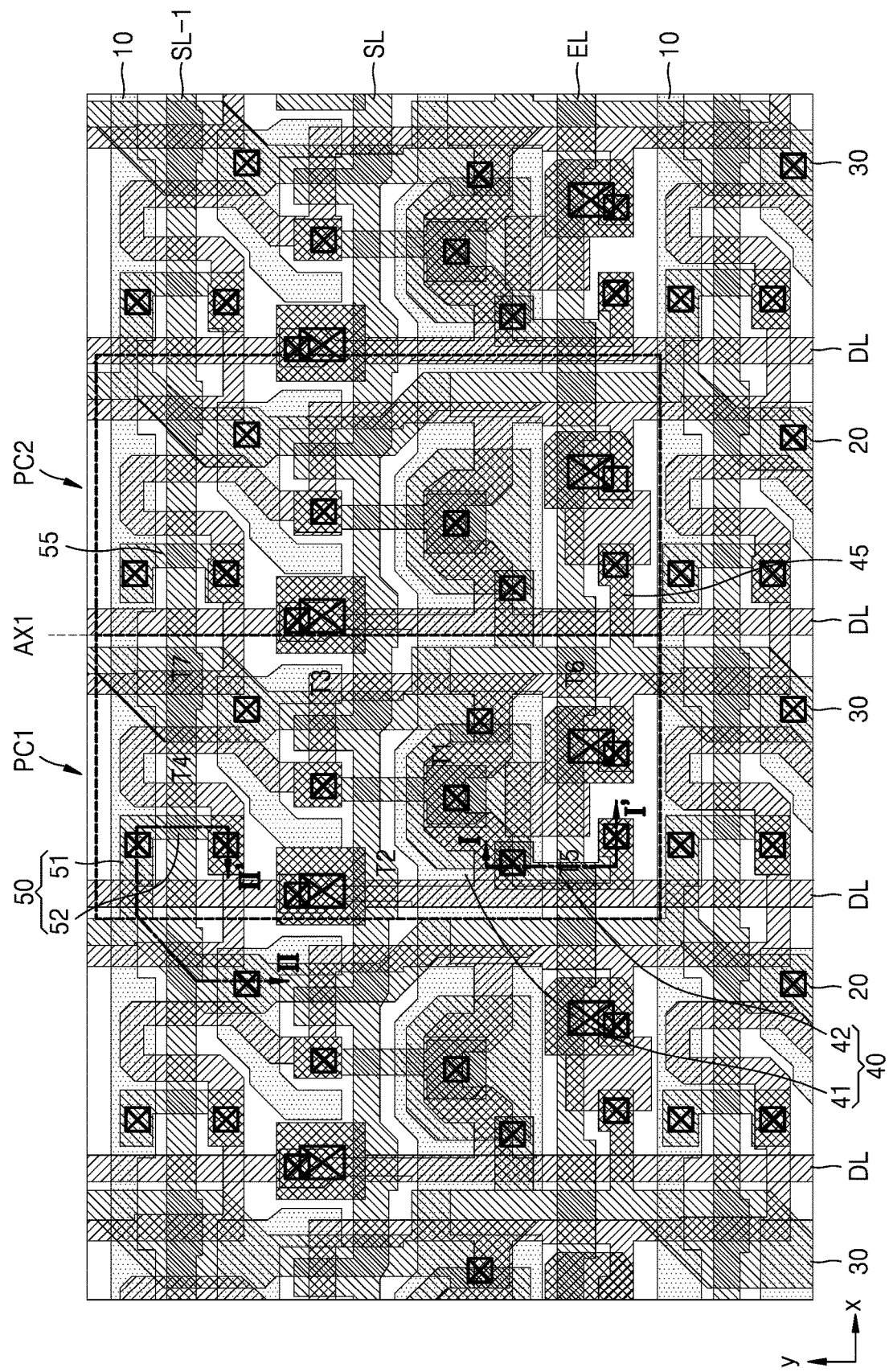
FIG. 3 is a plan view of pixel circuits arranged in a display area of a display apparatus according to some example embodiments.

FIG. 3 is a plan view of pixel circuits PCs arranged in a display area of a display apparatus according to some example embodiments. For reference, FIG. 3 omits the illustration of an organic light-emitting diode OLED. Referring to FIG. 3, the pixel circuits PC may be arranged in an x direction and a y direction. For example, the pixel circuits PC may be arranged in the x direction and the y direction to form a matrix. FIG. 3 illustrates a first pixel circuit PC1 and a second pixel circuit PC2 included in the arranged pixel circuits PCs, wherein the first and second pixel circuits PC1 and PC2 are arranged in a direction (for example, the x direction) to be adjacent to each other.

According to some example embodiments, the first pixel circuit PC1 and the second pixel circuit PC2 may have a laterally asymmetric structure. That is, the first pixel circuit PC1 and the second pixel circuit PC2 may be asymmetric with respect to each other based on a virtual first axis AX1 crossing between the first pixel circuit PC1 and the second pixel circuit PC2.

Each of the first and second pixel circuits PC1 and PC2 may include thin-film transistors and a storage capacitor. For example, the first and second pixel circuits PC1 and PC2 may include the thin-film transistors T1 through T7 and the storage capacitor Cst described above with reference to FIG. 2.

The scan line SL may extend in the x direction. The scan line SL may be electrically connected to the pixel circuits PC arranged in the x direction and may transmit a scan signal Sn.

The previous scan line SL-1 may extend in the x direction. The previous scan line SL-1 may be electrically connected to the pixel circuits PC arranged in the x direction and may transmit a previous scan signal Sn-1.

The emission control line EL may extend in the x direction. The emission control line EL may be electrically connected to the pixel circuits PC arranged in the x direction and may transmit an emission control signal En.

The initialization voltage line VL may include a first initialization voltage line 10 and a second initialization voltage line 20 electrically connected to the first initialization voltage line 10. The first initialization voltage line 10 may extend in a first direction (for example, the x direction), and the second initialization voltage line 20 may extend in a second direction (for example, the y direction) crossing the first direction. Accordingly, the first initialization voltage line 10 and the second initialization voltage line 20 may cross each other to form a mesh structure. The first initialization voltage line 10 may transmit an initialization voltage Vint to the pixel circuits PCs arranged in the x direction and the second initialization voltage line 20 may transmit an initialization voltage Vint to the pixel circuits PCs arranged in the y direction. The first initialization voltage line 10 and the second initialization voltage line 20 may be electrically connected to each other.

The driving voltage line 30 may extend in the y direction. The driving voltage line 30 may be electrically connected to the pixel circuits PCs arranged in the y direction and may transmit a driving voltage ELVDD. According to some example embodiments, the driving voltage line 30 and the second initialization voltage line 20 may be alternately located in the x direction. For example, according to some example embodiments, the driving voltage line 30 and the second initialization voltage line 20 may be alternately located between the pixel circuits PC arranged in the x direction. The driving voltage line 30 arranged between the pixel circuits PCs may be shared by neighboring pixel circuits PCs, for example, the first pixel circuit PC1 and the second pixel circuit PC2.

The data line DL may extend in the y direction. The data line DL may be electrically connected to the pixel circuits PCs arranged in the y direction and may transmit a data signal Dm. According to some example embodiments, the data line DL may be located between the second initialization voltage line 20 and the driving voltage line 30 that are neighboring to each other.

For convenience of explanation, the pixel circuits PCs will be described in more detail by referring more specifically to the first pixel circuit PC1 and the second pixel circuit PC2 as a pair of pixel circuits PC arranged in adjacent columns in the same row from among the plurality of pixel circuits PCs.

Figure 6:
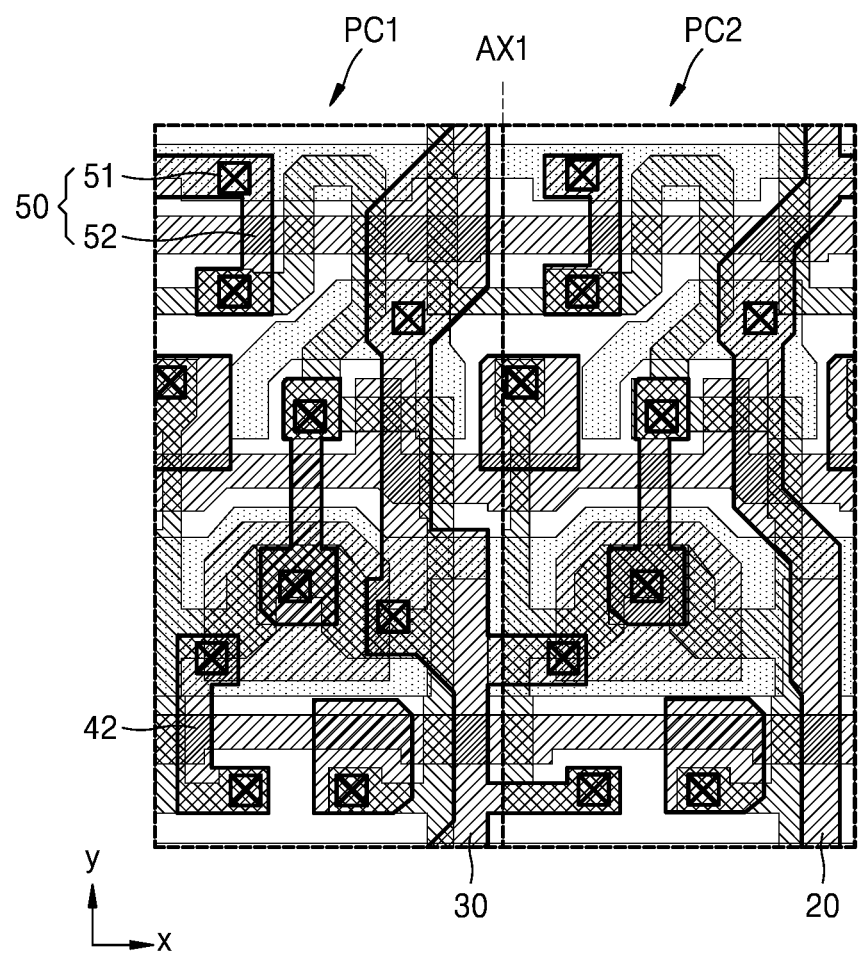
Figure 7:
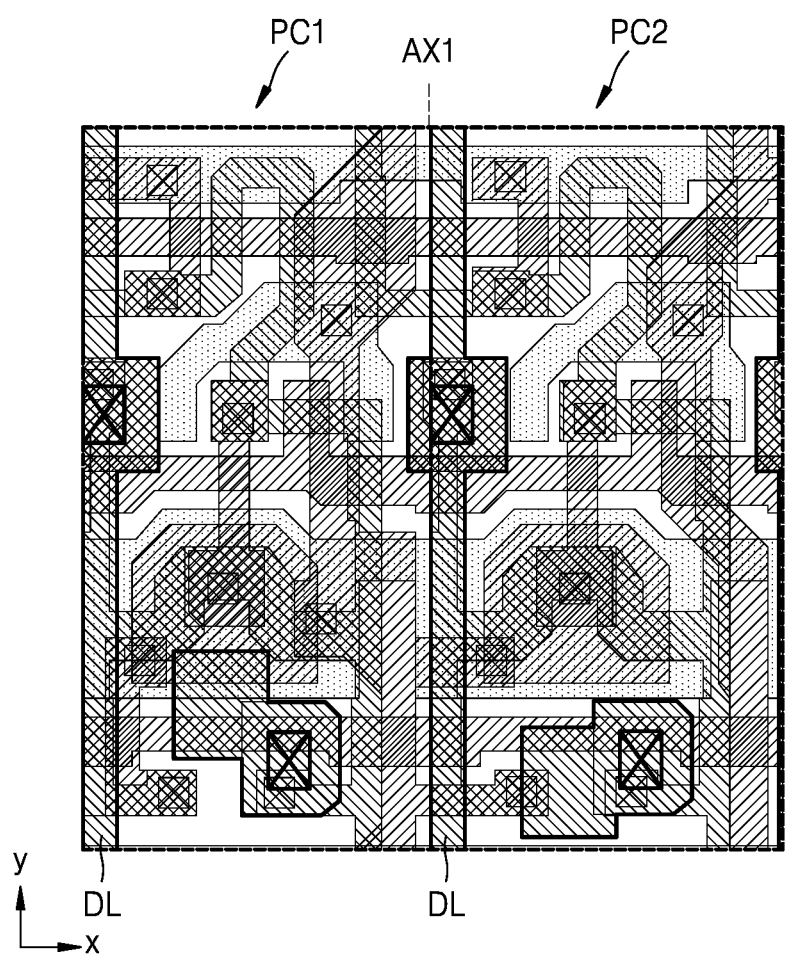
Figure 8:
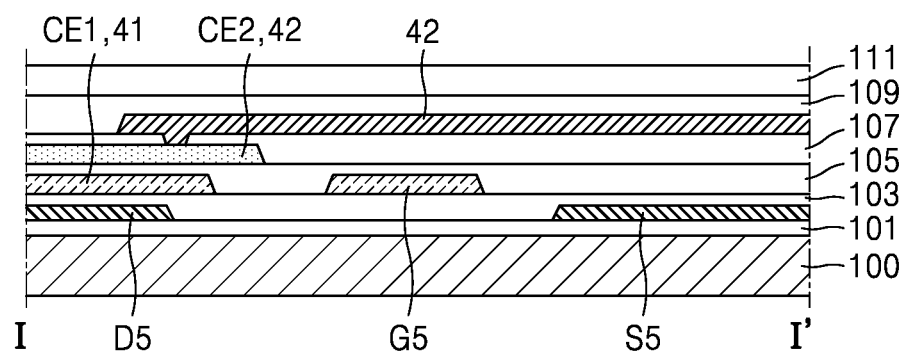
FIG. 8 is a cross-sectional view of the display apparatus of FIG. 3, taken along the line I-I' of FIG. 3.
Figure 9:
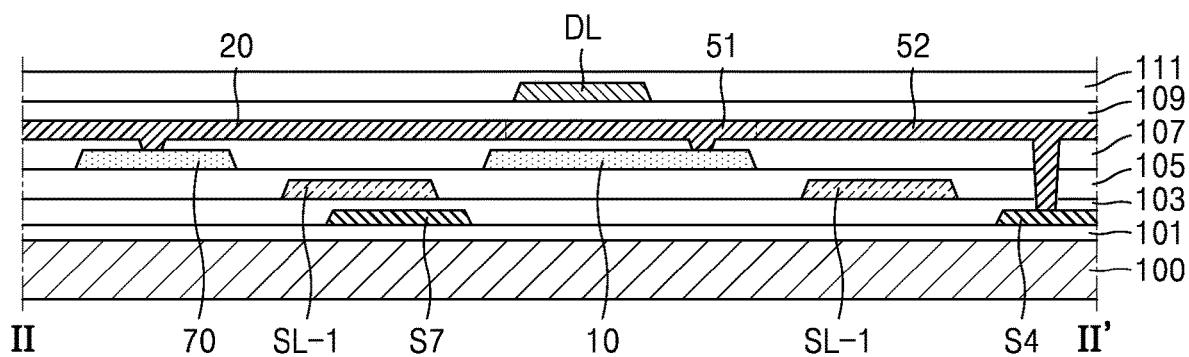
FIG. 9 is a cross-sectional view of the display apparatus of FIG. 3, taken along the line II-II' of FIG. 3.

FIGS. 4 through 7 are plan views for describing a process of forming the pixel circuits PC, according to some example embodiments, FIG. 8 is a cross-sectional view of the display apparatus of FIG. 3, taken along the line I-I' of FIG. 3, and FIG. 9 is a cross-sectional view of the display apparatus of FIG. 3, taken along the line II-II' of FIG. 3.

Figure 4:
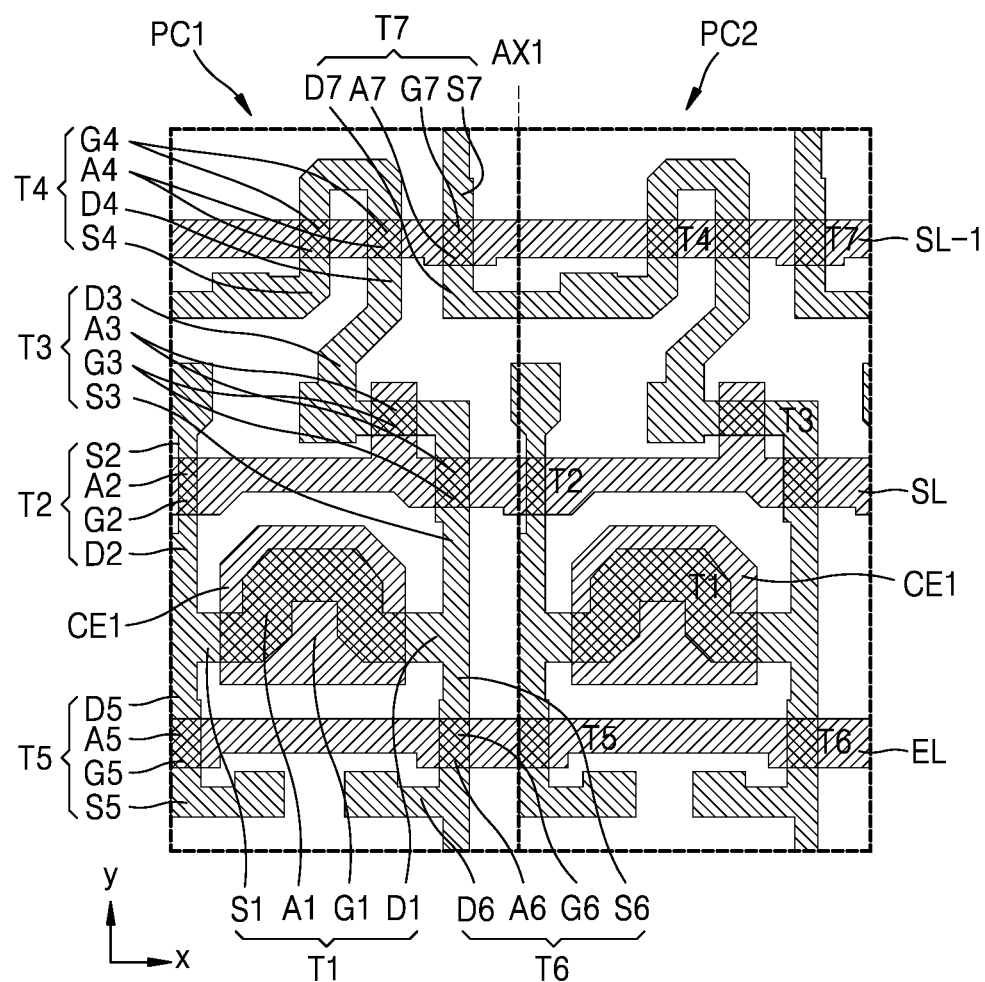
FIGS. 4 through 7 are plan views for describing a process of forming the pixel circuits of FIG. 3 according to some example embodiments.

Referring to FIG. 4, a semiconductor layer of the first pixel circuit PC1 and a semiconductor layer of the second pixel circuit PC2 may have substantially the same planar shape. The thin-film transistors T1 through T7 of each of the first and second pixel circuits PC1 and PC2 may be formed along the semiconductor layer bent in various directions. For example, a portion of the semiconductor layer may have a bent shape, such as a shape of "C," "Ω," "S," "M," or "W," and thus, a great channel length may be formed in a small space. Through this structure, the thin-film transistors T1 through T7 may have the long channel areas, thereby increasing a driving range of a gate voltage applied to the gate electrodes. Thus, light gradation emitted from the organic light-emitting diode OLED may be more finely adjusted and the quality of display may be increased. However, according to some example embodiments and according to the design of the display apparatus 1, portions of the semiconductor layer may have a straight shape, rather than a bent shape. Also, the semiconductor layer of the first pixel circuit PC1 and the semiconductor layer of the second pixel circuit PC2 may be connected to each other.

Each of the semiconductor layers of the first and second pixel circuits PC1 and PC2 may include a channel area of each of the thin-film transistors T1 through T7 of the first and second pixel circuits PC1 and PC2, a source area located at a side of the channel area, and a drain area located at the other side of the channel area. For example, the source areas and the drain areas of the semiconductor layer may be doped with impurities, which may include n-type impurities or p-type impurities. The source areas and the drain areas may respectively correspond to the source electrodes S1 through S7 and the drain electrodes D1 through D7. Hereinafter, for convenience of explanation, the source electrodes S1 through S7 and the drain electrodes D1 through D7 will be referred to as the source areas S1 through S7 and the drain areas D1 through D7, respectively.

The semiconductor layer of the driving thin-film transistor T1 of the first pixel circuit PC1 may include a driving channel area A1 overlapping the driving gate electrode G1, a driving source area S1 and a driving drain area D1 arranged at both sides of the driving channel area A1. The second pixel circuit PC2 may include the driving thin-film transistor T1 arranged at the same location as the driving thin-film transistor T1 of the first pixel circuit PC1, and a structure and a shape of the driving thin-film transistor T1 of the second pixel circuit PC2 may be the same as a structure and a shape of the driving thin-film transistor T1 of the first pixel circuit PC1.

The semiconductor layer of the switching thin-film transistor T2 of the first pixel circuit PC1 may include a switching channel area A2 overlapping the switching gate electrode G2, a switching source area S2 and a switching drain area D2 arranged at both sides of the switching channel area A2. The second pixel circuit PC2 may include the switching thin-film transistor T2 arranged at the same location as the switching thin-film transistor T2 of the first pixel circuit PC1, and a structure and a shape of the switching thin-film transistor T2 of the second pixel circuit PC2 may be the same as a structure and a shape of the switching thin-film transistor T2 of the first pixel circuit PC1.

The semiconductor layer of the compensation thin-film transistor T3 of the first pixel circuit PC1 may include a compensation channel area A3 overlapping the compensation gate electrode G3, a compensation source area S3 and a compensation drain area D3 arranged at both sides of the compensation channel area A3. The second pixel circuit PC2 may include the compensation thin-film transistor T3 arranged at the same location as the compensation thin-film transistor T3 of the first pixel circuit PC1, and a structure and a shape of the compensation thin-film transistor T3 of the second pixel circuit PC2 may be the same as a structure and a shape of the compensation thin-film transistor T3 of the first pixel circuit PC1.

The semiconductor layer of the initialization thin-film transistor T4 of the first pixel circuit PC1 may include an initialization channel area A4 overlapping the initialization gate electrode G4, an initialization source area S4 and an initialization drain area D4 arranged at both sides of the initialization channel area A4. The second pixel circuit PC2 may include the initialization thin-film transistor T4 arranged at the same location as the initialization thin-film transistor T4 of the first pixel circuit PC1, and a structure and a shape of the initialization thin-film transistor T4 of the second pixel circuit PC2 may be the same as a structure and a shape of the initialization thin-film transistor T4 of the first pixel circuit PC1.

The semiconductor layer of the operation control thin-film transistor T5 of the first pixel circuit PC1 may include an operation control channel area A5 overlapping the operation control gate electrode G5, an operation control source area S5 and an operation control drain area D5 arranged at both sides of the operation control channel area A5. The second pixel circuit PC2 may include the operation control thin-film transistor T5 arranged at the same location as the operation control thin-film transistor T5 of the first pixel circuit PC1, and a structure and a shape of the operation control thin-film transistor T5 of the second pixel circuit PC2 may be the same as a structure and a shape of the operation control thin-film transistor T5 of the first pixel circuit PC1.

The semiconductor layer of the emission control thin-film transistor T6 of the first pixel circuit PC1 may include an emission control channel area A6 overlapping the emission control gate electrode G6, an emission control source area S6 and an emission control drain area D6 arranged at both sides of the emission control channel area A6. The second pixel circuit PC2 may include the emission control thin-film transistor T6 arranged at the same location as the emission control thin-film transistor T6 of the first pixel circuit PC1, and a structure and a shape of the emission control thin-film transistor T6 of the second pixel circuit PC2 may be the same as a structure and a shape of the emission control thin-film transistor T6 of the first pixel circuit PC1.

The semiconductor layer of the reset thin-film transistor T7 of the first pixel circuit PC1 may include a reset channel area A7 overlapping the reset gate electrode G7, a reset source area S7 and a reset drain area D7 arranged at both sides of the reset channel area A7. The second pixel circuit PC2 may include the reset thin-film transistor T7 arranged at the same location as the reset thin-film transistor T7 of the first pixel circuit PC1, and a structure and a shape of the reset thin-film transistor T7 of the second pixel circuit PC2 may be the same as a structure and a shape of the reset thin-film transistor T7 of the first pixel circuit PC1.

Locations of the source areas S1 through S7 and the drain areas D1 through D7 of the thin-film transistors of each of the first and second pixel circuits PC1 and PC2 may be the same as or different from the locations illustrated in FIG. 3. According to some example embodiments, the source areas S1 through S7 illustrated in FIG. 3 may become the drain areas D1 through D7, and the drain areas D1 through D7 may become the source areas S1 through S7.

The semiconductor layer described above may be formed on the substrate 100. The substrate 100 may include glass, metal, or polymer resins. In the case where the substrate 100 has a flexible or bendable characteristic, the substrate 100 may include polymer resins, such as polyethersulphone, polyacrylate, polyetherimide, polyethylene naphthalate, polyethylene terephthalate, polyphenylene sulfide, polyarylate, polyimide, polycarbonate, or cellulose acetate propionate. However, various modifications may be possible. For example, the substrate 100 may have a multi-layered structure of two (or more) layers each including the polymer resins described above and a barrier layer between the two layers, the barrier layer including an inorganic material (such as silicon oxide, silicon nitride, silicon oxynitride, or the like).

However, one or more additional layers may be between the substrate 100 and the semiconductor layer. For example, a buffer layer 101 including at least one of a silicon nitride layer, a silicon oxynitride layer, a silicon oxide layer, a titanium oxide layer, or an aluminum oxide layer may be between the substrate 100 and the semiconductor layer. The buffer layer 101 may increase planarization of an upper surface of the substrate 100 or prevent, reduce, or minimize penetration of impurities or contaminants from the substrate 100, etc. into the semiconductor layer, etc. The buffer layer 101 may have a single-layered structure or a multi-layered structure according to necessity. In the case of the multi-layered structure, one or more layers of the buffer layer 101 may be referred to as barrier layers.

Also, the semiconductor layer may include a semiconductor layer including polycrystalline silicon or a semiconductor layer including oxide. For example, the semiconductor layer may include Zn oxide-based materials, such as a Zn oxide, an In—Zn oxide, or a Ga—In—Zn oxide. However, the semiconductor layer is not limited thereto and various modifications may be made. For example, the semiconductor layer may include an oxide semiconductor, such as In—Ga—Zn—O (IGZO), In—Sn—Zn—O (ITZO), or In—Ga—Sn—Zn—O (IGTZO), which includes a metal, such as In, Ga, or Sn, in ZnO.

A first gate insulating layer 103 may be formed on the semiconductor layers of the first and second pixel circuits PC1 and PC2, and the scan line SL, the previous scan line SL-1, the emission control line EL, and the gate electrodes G1 through G7 of the thin-film transistors T1 through T7 may be formed on the first gate insulating layer 103. Here, the driving gate electrode G1 of the driving thin-film transistor T1 may function not only as a control electrode of the driving thin-film transistor T1, but also as the lower electrode CE1 of the storage capacitor Cst. That is, the driving gate electrode G1 and the lower electrode CE1 of the storage capacitor Cst may be integral with each other.

The scan line SL, the previous scan line SL-1, the emission control line EL may extend in the x direction and may be electrically connected to the first and second pixel circuits PC1 and PC2. The scan line SL, the previous scan line SL-1, or the emission control line EL may be integral with one or more of the gate electrodes G1 through G7 of the thin-film transistors T1 through T7. For example, the previous scan line SL-1 may be integral with the initialization gate electrode G4 of the initialization thin-film transistor T4 and the reset gate electrode G7 of the reset thin-film transistor T7, the scan line SL may be integral with the switching gate electrode G2 of the switching thin-film transistor T2 and the compensation gate electrode G3 of the compensation thin-film transistor T3, and the emission control line EL may be integral with the operation control gate electrode G5 of the operation control thin-film transistor T5 and the emission control gate electrode G6 of the emission control thin-film transistor T6. The driving gate electrode G1 (or the lower electrode CE1 of the storage capacitor Cst) may have an isolated shape.

The signal lines SL, SL-1, and EL, the gate electrodes G1 through G7, and the lower electrode CE1 may include the same materials and the same layer structures as one another. For example, the signal lines SL, SL-1, and EL, the gate electrodes G1 through G7, and the lower electrode CE1 may include Al, Pt, Pd, Ag, Mg, Au, Ni, Nd, Ir, Cr, Li, Ca, Mo, Ti, W, Cu, etc. However, each of the scan line SL, the previous scan line SL-1, the emission control line EL, the gate electrodes G1 through G7 of the thin-film transistors T1 through T7, and the lower electrode CE1 of the storage capacitor Cst may have a single-layered structure or a multi-layered structure. When each of the scan line SL, the previous scan line SL-1, the emission control line EL, the gate electrodes G1 through G7 of the thin-film transistors T1 through T7, and the lower electrode CE1 of the storage capacitor Cst has a multi-layered structure, each of the scan line SL, the previous scan line SL-1, the emission control line EL, the gate electrodes G1 through G7 of the thin-film transistors T1 through T7, and the lower electrode CE1 of the storage capacitor Cst may include various materials. For example, the multi-layered structure may include a double-layered structure of a Mo layer/an Al layer, a triple-layered structure of a Mo layer/an Al layer/a Mo layer, etc.

The first gate insulating layer 103, a second gate insulating layer 105, a first interlayer insulating layer 107, and a second interlayer insulating layer 109 to be described below may include silicon oxide, silicon nitride, silicon oxynitride, aluminum oxide, titanium oxide, tantalum oxide, hafnium oxide, and/or zinc oxide. Each of the insulating layers 103, 105, 107, and 109 may have a single-layered structure or a multi-layered structure according to necessity. Also, contact holes through which components of different layers may be electrically connected to one another may be formed in the insulating layers 103, 105, 107, and 109.

Figure 5:
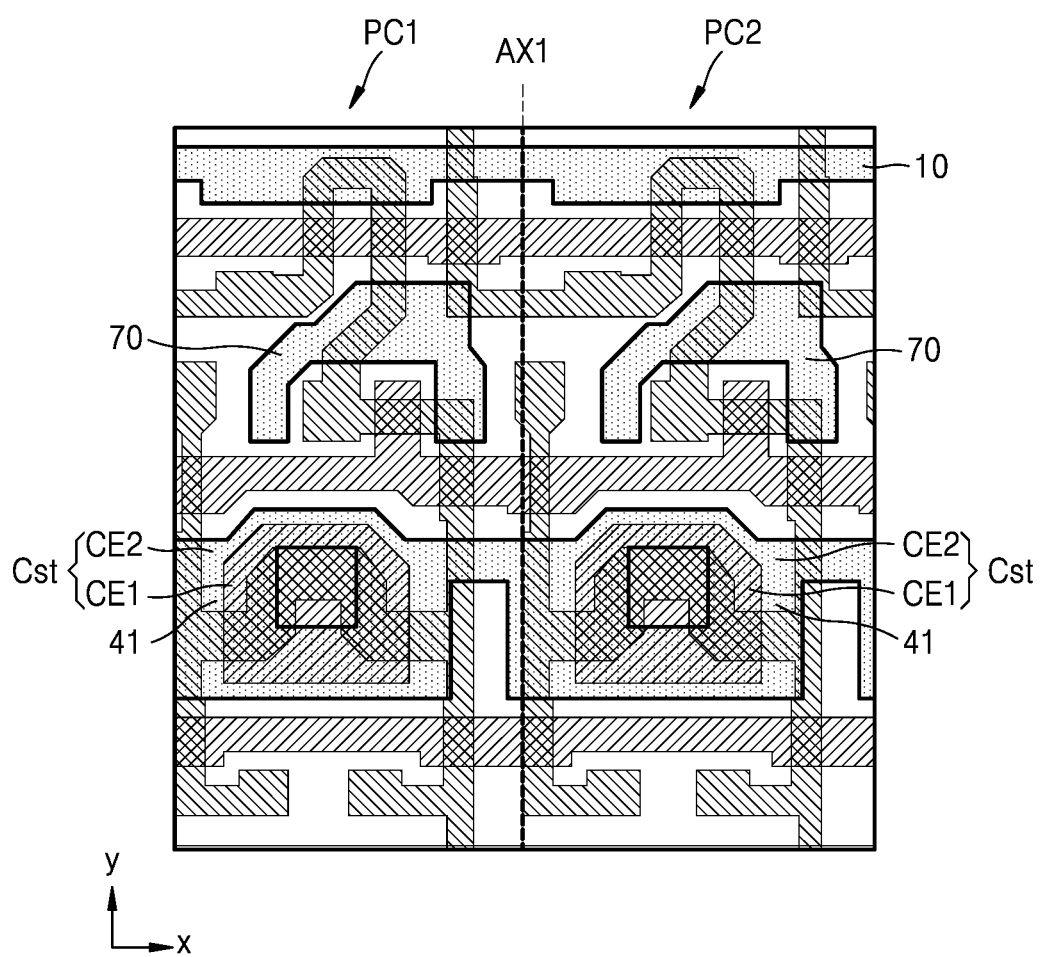

Referring to FIG. 5, after the second gate insulating layer 105 is formed on a structure of FIG. 4, the first initialization voltage line 10, a shield electrode 70, and the upper electrode CE2 of the storage capacitor Cst may be formed on the second gate insulating layer 105.

The first initialization voltage line 10 may extend in the x direction and may be electrically connected to the first pixel circuit PC1 and the second pixel circuit PC2.

The shield electrode 70 may have an isolated shape and may be located such that a portion of the shield electrode 70 overlaps the compensation thin-film transistor T3. The shield electrode 70 may increase the stability and the reliability of a voltage value of the compensation thin-film transistor T3.

The storage capacitor Cst may include the lower electrode CE1 and the upper electrode CE2, and the lower electrode CE1 and the upper electrode CE2 may overlap each other with an insulating layer therebetween, thereby forming a capacitance. In this case, the second gate insulating layer 105 between the lower electrode CE1 and the upper electrode CE2 may function as a dielectric layer of the storage capacitor Cst. The upper electrode CE2 of the storage capacitor Cst may function not only as the upper electrode CE2 of the storage capacitor Cst, but also as the 1-1$^{st}$ connection electrode 41. That is, the upper electrode CE2 of the storage capacitor Cst and the 1-1$^{st}$ connection electrode 41 may be integral with each other.

The first initialization voltage line 10, the shield electrode 70, and the upper electrode CE2 located on the second gate insulating layer 105 may include the same materials and have the same layered structures as the signal lines SL, SL-1, and EL, the gate electrodes G1 through G7, and the lower electrode CE1 located on the first gate insulating layer 103. For example, the first initialization voltage line 10, the shield electrode 70, and the upper electrode CE2 may have a multi-layered structure, such as a double-layered structure of a Mo layer/an Al layer, a triple-layered structure of a Mo layer/an Al layer/a Mo layer, etc.

Referring to FIG. 6, the first interlayer insulating layer 107 may be located on a structure of FIG. 5, and the driving voltage line 30, the second initialization voltage line 20, a 1-2$^{nd}$ connection electrode 42, and a second connection electrode 50 may be located on the first interlayer insulating layer 107.

For reference, contact holes illustrated in FIG. 6 may be formed in the first gate insulating layer 103, the second gate insulating layer 105, and/or the first interlayer insulating layer 107 to electrically connect the layers illustrated in FIG. 6 with layers therebelow.

The driving voltage line 30 may extend in they direction between the first pixel circuit PC1 and the second pixel circuit PC2 and may be electrically connected to the operation control thin-film transistor T5 of the first pixel circuit PC1 and the operation control thin-film transistor T5 of the second pixel circuit PC2. That is, the operation control thin-film transistor T5 of the first pixel circuit PC1 and the operation control thin-film transistor T5 of the second pixel circuit PC2 may share one driving voltage line 30. Thus, the driving voltage line 30 may be electrically connected to the first pixel circuit PC1 located at a side of the driving voltage line 30 and to the second pixel circuit PC2 located at the other side of the driving voltage line 30. Also, the driving voltage line 30 may supply a voltage to each of the first and second pixel circuits PC1 and PC2 through a different path.

A path through which the driving voltage line 30 supplies a voltage to the first pixel circuit PC1 will be described by referring to FIG. 8.

The driving voltage line 30 may be electrically connected to the semiconductor layer of the operation control thin-film transistor T5 of the first pixel circuit PC1 through a first connection electrode 40. The first connection electrode 40 may include the 1-1$^{st}$ connection electrode 41 and the 1-2$^{nd}$ connection electrode 42. The 1-1$^{st}$ connection electrode 41 may correspond to a portion of any one of electrodes of the storage capacitor Cst of the first pixel circuit PC1 and may contact the driving voltage line 30. The 1-2$^{nd}$ connection electrode 42 may contact the 1-1$^{st}$ connection electrode 41 and the semiconductor layer of the operation control thin-film transistor T5 of the first pixel circuit PC1.

For example, the 1-1$^{st}$ connection electrode 41 may correspond to a portion of the upper electrode CE2 of the storage capacitor Cst and may be electrically connected to the driving voltage line 30 through a contact hole located in a region in which the 1-1$^{st}$ connection electrode 41 overlaps the driving voltage line 30. Also, the 1-1$^{st}$ connection electrode 41 may be electrically connected to the 1-2$^{nd}$ connection electrode 42 through a contact hole located in a region in which the 1-1$^{st}$ connection electrode 41 overlaps the 1-2$^{nd}$ connection electrode 42. The 1-2$^{nd}$ connection electrode 42 may extend from a contact hole located at an end of the 1-2$^{nd}$ connection electrode 42 and connected to the 1-1$^{st}$ connection electrode 41 in a direction toward the operation control thin-film transistor T5 of the first pixel circuit PC1. The 1-2$^{nd}$ connection electrode 42 may be electrically connected to the semiconductor layer of the operation control thin-film transistor T5 of the first pixel circuit PC1 through a contact hole located at the other end of the 1-2$^{nd}$ connection electrode 42 in a region in which the 1-2$^{nd}$ connection electrode 42 overlaps the semiconductor layer of the operation control thin-film transistor T5 of the first pixel circuit PC1.

Accordingly, a driving voltage ELVDD may arrive at the operation control source electrode S5 of the semiconductor layer of the operation control thin-film transistor T5 of the first pixel circuit PC1 by passing through the 1-1$^{st}$ connection electrode 41 and the 1-2$^{nd}$ connection electrode 42 from the driving voltage line 30. The driving voltage ELVDD arriving at the operation control source electrode S5 may arrive at the organic light-emitting diode OLED by passing through the driving thin-film transistor T1 and the emission control thin-film transistor T6 of the first pixel circuit PC1.

A path in which the driving voltage line 30 supplies a voltage to the second pixel circuit PC2 may be different from the path in which the driving voltage line 30 supplies a voltage to the first pixel circuit PC1 described above. The path in which the driving voltage line 30 supplies a voltage to the second pixel circuit PC2 may not require the first connection electrode 40.

For example, the driving voltage line 30 may include a protrusion 45 which may function as a connection electrode. The protrusion 45 of the driving voltage line 30 may be integral with the driving voltage line 30 and may overlap the semiconductor layer of the operation control thin-film transistor T5 of the second pixel circuit PC2. The driving voltage line 30 may be electrically connected to the semiconductor layer of the operation control thin-film transistor T5 of the second pixel circuit PC2 through a contact hole located in the protrusion 45. Accordingly, a driving voltage ELVDD may arrive at the operation control source electrode S5 of the second pixel circuit PC2 through the protrusion 45 from the driving voltage line 30. The driving voltage ELVDD arriving at the operation control source electrode S5 may arrive at the organic light-emitting diode OLED by passing through the driving thin-film transistor T1 and the emission control thin-film transistor T6 of the second pixel circuit PC2.

As described above, the driving voltage line 30 may supply the driving voltage ELVDD to the pixel circuits PCs located at both sides of the driving voltage line 30 through the different paths. Thus, the two adjacent pixel circuits PCs, which are asymmetric with each other based on the driving voltage line 30, may be connected to one driving voltage line 30.

The second initialization voltage line 20 may correspond to a portion of the initialization voltage line VL and extend in the y direction. The initialization voltage line VL may include the first initialization voltage line 10 electrically connected to the first pixel circuit PC1 and the second pixel circuit PC2 and extending in a first direction (for example, the x direction) and the second initialization voltage line 20 electrically connected to the first initialization voltage line 10 and extending in a second direction (for example, the y direction) crossing the first direction. The first initialization voltage line 10 and the second initialization voltage line 20 may cross each other to form a mesh structure. Also, the first initialization voltage line 10 and the second initialization voltage line 20 may be located on different layers and may be electrically connected to each other through the second connection electrode 50. Each of the first initialization voltage line 10 and the second initialization voltage line 20 may be electrically connected to the pixel circuit PC adjacent thereto, and may supply an initialization voltage Vint.

The second initialization voltage line 20 and the driving voltage line 30 may extend in the second direction (for example, the y direction) throughout the plurality of pixel circuits PCs and may be arranged to be apart from each other according to a pattern that is pre-set. Here, the second initialization voltage line 20 and the driving voltage line 30 may be alternately arranged between the pixel circuits PCs, such that one second initialization voltage 20 and one driving voltage line 30 may be located for each pair of pixel circuits PC.

Accordingly, the second initialization voltage line 20 and the driving voltage line 30 may be alternately electrically connected to the shield electrode 70 included in each of the pixel circuits PC. For example, the shield electrode 70 of the first pixel circuit PC1 may be electrically connected to the driving voltage line 30, and the shield electrode 70 of the second pixel circuit PC2 may be electrically connected to the second initialization voltage line 20. Here, a portion of the semiconductor layer of the compensation thin-film transistor T3 of the first pixel circuit PC1 may overlap the shield electrode 70 electrically connected to the driving voltage line 30, and a portion of the semiconductor layer of the compensation thin-film transistor T3 of the second pixel circuit PC2 may overlap the shield electrode 70 electrically connected to the second initialization voltage line 20. FIG. 9 illustrates that the second initialization voltage line 20 is electrically connected to the shield electrode 70 in the second pixel circuit PC2 through a contact hole located in a region in which the second initialization voltage line 20 and the shield electrode 70 overlap each other. Thus, even when the driving voltage line 30 is not located to correspond to each of the pixel circuits PCs and two pixel circuits PCs share one driving voltage line 30, the shield electrode 70 located in each of the pixel circuits PCs may receive a constant voltage from the second initialization voltage line 20 or the driving voltage line 30.

As illustrated in FIGS. 5 and 6, the first initialization voltage line 10 and the second initialization voltage line 20 are located on different layers from each other. The first initialization voltage line 10 and the second initialization voltage line 20 may be electrically connected to each other through the second connection electrode 50 which is integral with the second initialization voltage line 20. The second connection electrode 50 will be described in more detail with reference to FIG. 9.

The second connection electrode 50 may include a $2\text{-}1^{st}$ connection electrode 51 and a $2\text{-}2^{nd}$ connection electrode 52. The $2\text{-}1^{st}$ connection electrode 51 may overlap a portion of the first initialization voltage line 10 and may electrically connect the first initialization voltage line 10 to the second initialization voltage line 20. The $2\text{-}2^{nd}$ connection electrode 52 may extend in a direction away from the $2\text{-}1^{st}$ connection electrode 51 and may electrically connect the first initialization voltage line 10 to the semiconductor layer of the initialization thin-film transistor T4 of the first pixel circuit PC1. As illustrated in FIG. 9, the $2\text{-}1^{st}$ connection electrode 51 may extend from the second initialization voltage line 20 and may be electrically connected to the first initialization voltage line 10 through a contact hole located in a region in which the $2\text{-}1^{st}$ connection electrode 51 overlaps the first initialization voltage line 10. Also, the $2\text{-}1^{st}$ connection electrode 51 may extend in a direction away from the first initialization voltage line 10 and may be electrically connected to the initialization source electrode S4 of the first pixel circuit PC1 through a contact hole located in a region in which the $2\text{-}1^{st}$ connection electrode 51 overlaps the semiconductor layer of the initialization thin-film transistor T4 of the first pixel circuit PC1. Accordingly, the initialization thin-film transistor T4 of the first pixel circuit PC1 may receive an initialization voltage Vint from the second initialization voltage line 20 through the first initialization voltage line 10.

The initialization thin-film transistor T4 of the second pixel circuit PC2 may receive an initialization voltage Vint from the first initialization voltage line 10 through a bridge electrode 55 electrically connecting the initialization thin-film transistor T4 with the first initialization voltage line 10. That is, the first pixel circuit PC1 and the second pixel circuit PC2 may receive the initialization voltage Vint from the first initialization voltage line 10 or the second initialization voltage line 20 through different paths from each other.

The second initialization voltage line 20, the driving voltage line 30, the $1\text{-}2^{nd}$ connection electrode 42, and the second connection electrode 50 may include the same materials and have the same layered structures. Accordingly, the second initialization voltage line 20 and the driving voltage line 30 may be simultaneously formed in one process, and thus, the process efficiency may be increased.

For example, the second initialization voltage line 20, the driving voltage line 30, the $1\text{-}2^{nd}$ connection electrode 42, and the second connection electrode 50 may include Al, Pt, Pd, Ag, Mg, Au, Ni, Nd, Ir, Cr, Li, Ca, Mo, Ti, W, and Cu. Each of the second initialization voltage line 20, the driving voltage line 30, the $1\text{-}2^{nd}$ connection electrode 42, and the second connection electrode 50 may have a single-layered structure or a multi-layered structure. When each of the second initialization voltage line 20, the driving voltage line 30, the $1\text{-}2^{nd}$ connection electrode 42, and the second connection electrode 50 has a multi-layered structure, each of the second initialization voltage line 20, the driving voltage line 30, the $1\text{-}2^{nd}$ connection electrode 42, and the second connection electrode 50 may include various materials. For example, the multi-layered structure may include a double-layered structure of a Ti layer/an Al layer, a triple-layered structure of a Ti layer/an Al layer/a Ti layer, etc.

Referring to FIG. 7, the second interlayer insulating layer 109 may be located on a structure of FIG. 6, and the data line DL may be located on the second interlayer insulating layer 109.

For reference, contact holes illustrated in FIG. 7 may be formed in the second interlayer insulating layer 109 to electrically connect layers illustrated in FIG. 7 to layers therebelow. The layers on the second interlayer insulating layer 109 may be electrically connected to the pixel electrode of the organic light-emitting diode OLED located on a planarization layer 111 covering a structure of FIG. 7, through the contact hole formed in the planarization layer 111. Here, the planarization layer 111 may include an organic material, such as acryl, benzocyclobutene (BCB), polyimide, hexamethyldisiloxane (HMDSO), etc. However, the disclosure is not limited thereto, and the planarization layer 111 may include an inorganic material according to necessity and may have a single-layered structure or a multi-layered structure.

The data line DL may extend in they direction and may be electrically connected to the switching source electrode S2 of the switching thin-film transistor T2. For example, the data line DL may be electrically connected to a layer between the switching source electrode S2 and the data line DL, through a contact hole located in a region in which the data line DL overlaps the switching source electrode S2. Here, the layer between the switching source electrode S2 and the data line DL may be electrically connected to the switching source electrode S2 through a contact hole located in a region in which the layer overlaps the switching source electrode S2.

The data line DL may include the same material or the same single-layered structure or the same multi-layered structure as the second initialization voltage line 20, the driving voltage line 30, the 1-$2^{nd}$ connection electrode 42, and the second connection electrode 50. For example, the data line DL may include a double-layered structure of a Ti layer/an Al layer, a triple-layered structure of a Ti layer/an Al layer/a Ti layer, etc.

FIG. 10 is a plan view of pixel circuits PCs arranged in a display area of a display apparatus according to some example embodiments. For reference, FIG. 10 omits the illustration of the organic light-emitting diode OLED.

According to some example embodiments, the first pixel circuit PC1 and the second pixel circuit PC2 may have a laterally symmetric structure. That is, the first pixel circuit PC1 and the second pixel circuit PC2 may be symmetric with respect to each other based on a virtual second axis AX2 crossing between the first pixel circuit PC1 and the second pixel circuit PC2.

The aspects described above with reference to FIGS. 1 through 9 may be identically applied to the present embodiment. Hereinafter, the same aspects will not be described and different aspects will be mainly described. Referring to FIG. 10, the pixel circuits PC may be arranged in an x direction and a y direction to form a matrix. For example, FIG. 10 illustrates the first pixel circuit PC1 and the second pixel circuit PC2 arranged in a direction (for example, the x direction) to be adjacent to each other.

The first and second pixel circuits PC1 and PC2 according to some example embodiments may include the thin-film transistors T1 through T7, the storage capacitor Cst, and the signal lines SL, SL-1, EL, and DL described above with reference to FIG. 2.

The first initialization voltage line 10 and the signal lines SL, SL-1, EL, and DL may extend in the x direction and may be arranged to be apart from each other. Each of the first initialization voltage line 10 and the signal lines SL, SL-1, EL, and DL may be electrically connected to the pixel circuits PC arranged in the x direction.

The second initialization voltage line 20 and the driving voltage line 30 may extend in the y direction between the first pixel circuit PC1 and the second pixel circuit PC2. The second initialization voltage line 20 may overlap the driving voltage line 30. Based on this structure, spaces for the second initialization voltage line 20 and the driving voltage line 30 may not be required, and thus, a spatial usability of the display area may be increased.

A data line DL may extend in the y direction. The data line DL may be located at both sides of the second initialization voltage line 20 or the driving voltage line 30.

FIGS. 11 through 14 are plan views for describing a process of forming the pixel circuits PCs, according to some example embodiments.

Figure 11:
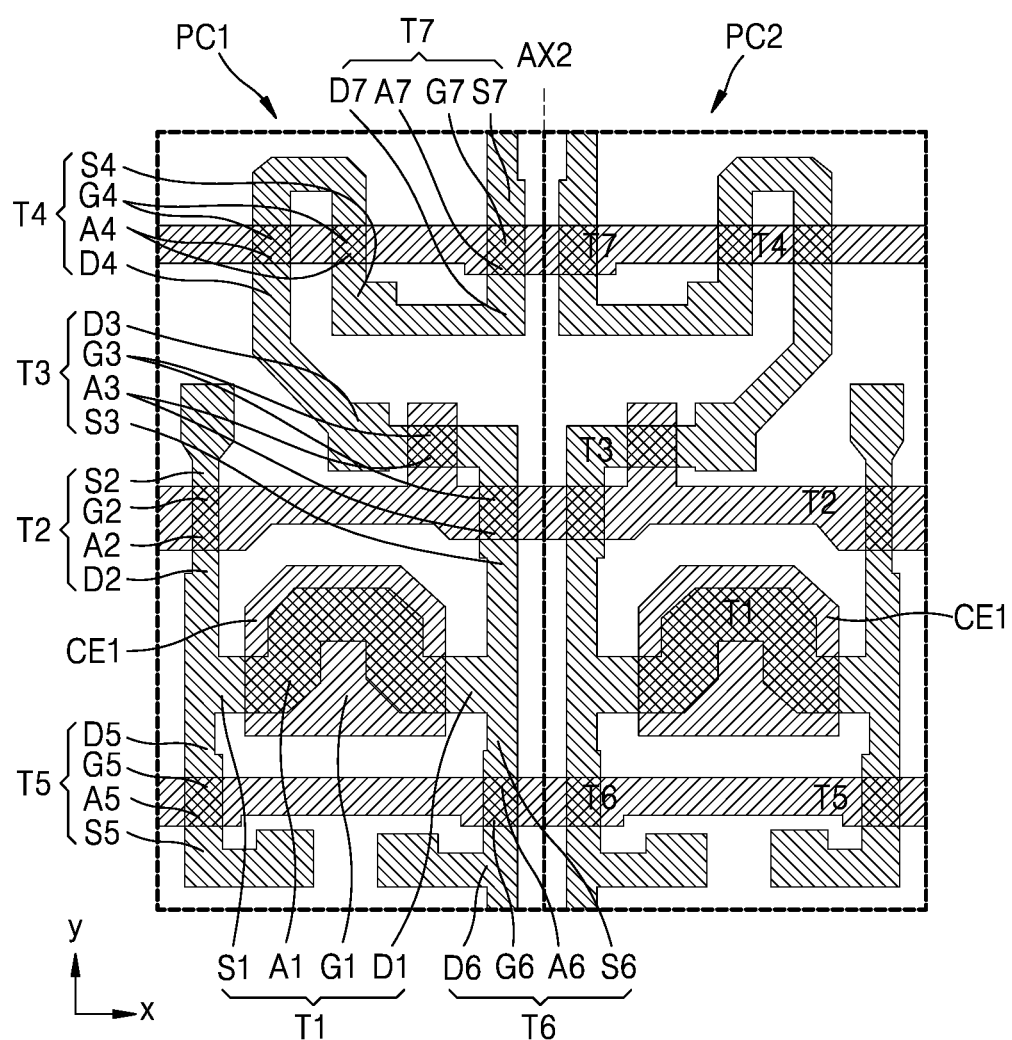
FIGS. 11 through 14 are plan views for describing a process of forming the pixel circuits of FIG. 10.

Referring to FIG. 11, a semiconductor layer of the first pixel circuit PC1 and a semiconductor layer of the second pixel circuit PC2 may be located on the substrate 100 as a shape bent in various directions. Here, the semiconductor layer of the first pixel circuit PC1 and the semiconductor layer of the second pixel circuit PC2 may be connected to each other and may be symmetric with each other based on a virtual second axis AX2 therebetween.

The semiconductor layer may include the same material as the semiconductor layer according to the embodiments described above. For example, the semiconductor layer may include a semiconductor layer including polycrystalline silicon or a semiconductor layer including oxide.

The first gate insulating layer 103 may be located on the semiconductor layers of the first and second pixel circuits PC1 and PC2, and the scan line SL, the previous scan line SL-1, the emission control line EL, and the gate electrodes G1 through G7 of the thin-film transistors T1 through T7 may be located on the first gate insulating layer 103. Here, the driving gate electrode G1 of the driving thin-film transistor T1 may function not only as a control electrode of the driving thin-film transistor T1, but also as the lower electrode CE1 of the storage capacitor Cst. That is, the driving gate electrode G1 and the lower electrode CE1 of the storage capacitor Cst may be integral with each other.

Like the embodiments described above, at least one or more of the signal lines SL, SL-1, and EL may be integral with at least one or more of the gate electrodes G1 through G7. Also, the signal lines SL, SL-1, and EL, the gate electrodes G1 through G7, and the lower electrode CE1 may include the same materials and the same layer structures as one another. For example, the signal lines SL, SL-1, and EL, the gate electrodes G1 through G7, and the lower electrode CE1 may have a double-layered structure of a Mo layer/an Al layer, a triple-layered structure of a Mo layer/an Al layer/a Mo layer, etc.

Figure 12:
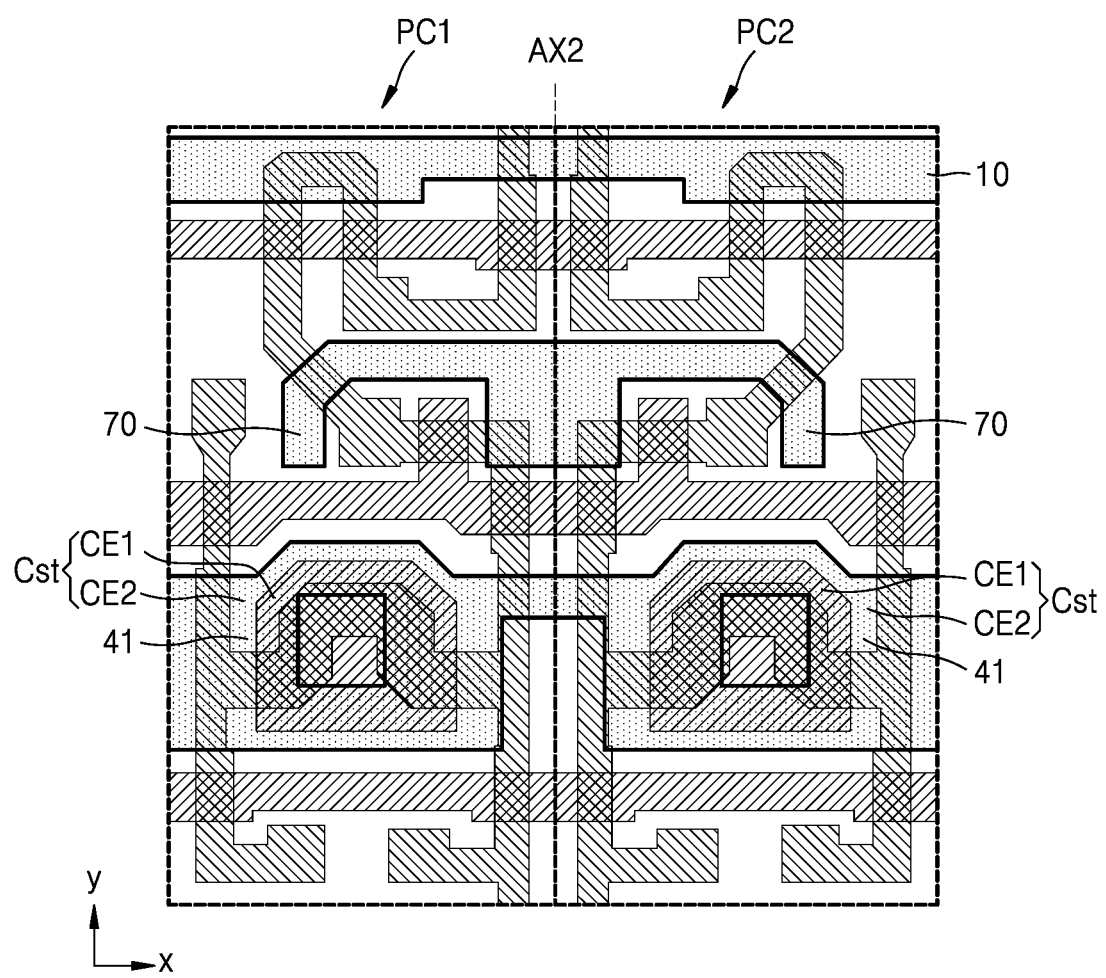

Referring to FIG. 12, the second gate insulating layer 105 may be located on a structure of FIG. 11, and the first initialization voltage line 10, the shield electrode 70, and the upper electrode CE2 of the storage capacitor Cst may be located on the second gate insulating layer 105. Here, the first initialization voltage line 10, the shield electrode 70, and the upper electrode CE2 of the first pixel circuit PC1 and the first initialization voltage line 10, the shield electrode 70, and the upper electrode CE2 of the second pixel circuit PC2 may be symmetric with each other based on a virtual second axis AX2.

The first initialization voltage line 10 may extend in an x direction and may be electrically connected to the first pixel circuit PC1 and the second pixel circuit PC2.

The shield electrode 70 may have an isolated shape. The shield electrode 70 may be integral throughout the first pixel circuit PC1 and the second pixel circuit PC2. Also, a portion of the shield electrode 70 may overlap the compensation thin-film transistor T3 of the first pixel circuit PC1 and the compensation thin-film transistor T3 of the second pixel circuit PC2.

The storage capacitor Cst may include the lower electrode CE1 and the upper electrode CE2, and the lower electrode CE1 and the upper electrode CE2 may overlap each other with an insulating layer therebetween, thereby forming a capacitance. In this case, the second gate insulating layer 105 between the lower electrode CE1 and the upper electrode CE2 may function as a dielectric layer of the storage capacitor Cst.

The first initialization voltage line 10, the shield electrode 70, and the upper electrode CE2 located on the second gate insulating layer 105 may include the same materials and have the same layered structures as the signal lines SL, SL-1, and EL, the gate electrodes G1 through G7, and the lower electrode CE1 located on the first gate insulating layer 103. For example, the first initialization voltage line 10, the shield electrode 70, and the upper electrode CE2 may have a multi-layered structure, such as a double-layered structure of a Mo layer/an Al layer, a triple-layered structure of a Mo layer/an Al layer/a Mo layer, etc.

Figure 13:
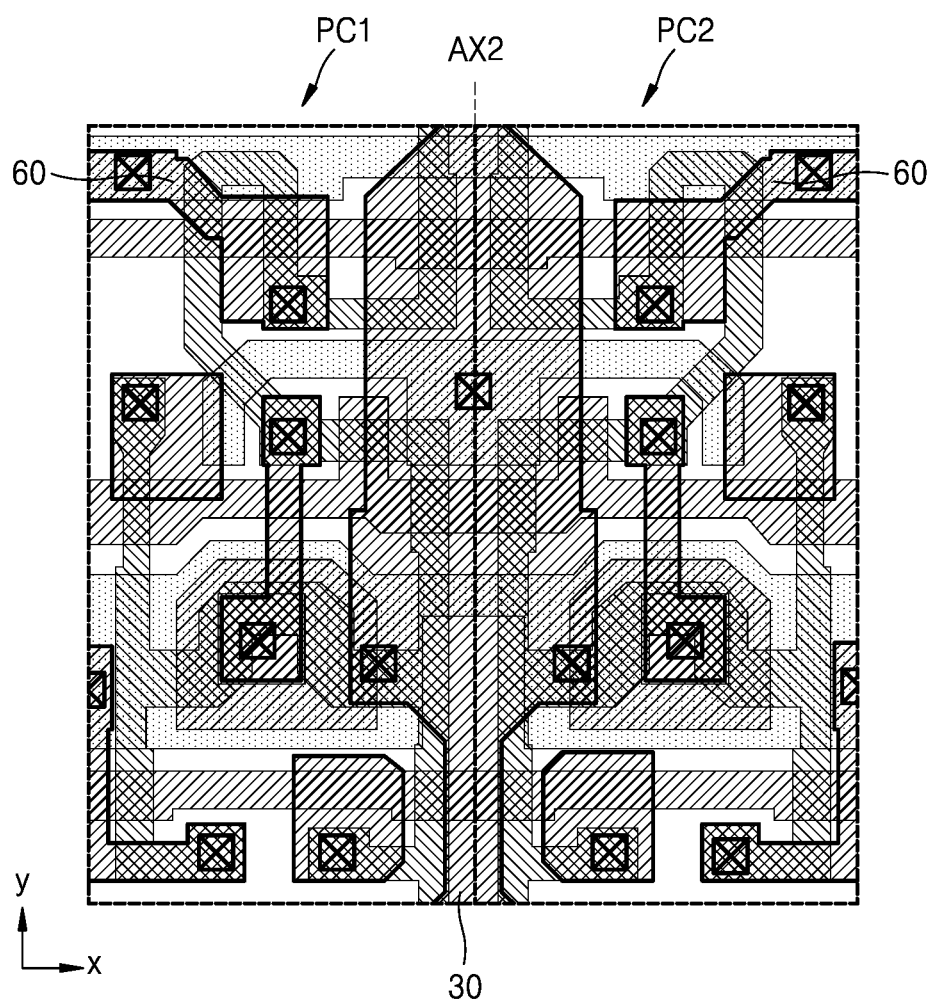

Referring to FIG. 13, the first interlayer insulating layer 107 may be located on a structure of FIG. 12, and the driving voltage line 30 and a third connection electrode 60 may be located on the first interlayer insulating layer 107. Here, the driving voltage line 30 may overlap a virtual second axis AX2 and may be symmetric with respect to the virtual second axis AX2. The third connection electrode 60 of the first pixel circuit PC1 and the third connection electrode 60 of the second pixel circuit PC2 may also be symmetric with each other based on the virtual second axis AX2.

For reference, contact holes illustrated in FIG. 13 may be formed in the first gate insulating layer 103, the second gate insulating layer 105, and/or the first interlayer insulating layer 107 to electrically connect the layers illustrated in FIG. 13 with layers therebelow.

The driving voltage line 30 may extend in a y direction between the first pixel circuit PC1 and the second pixel circuit PC2 and may be electrically connected to the operation control thin-film transistor T5 of the first pixel circuit PC1 and the operation control thin-film transistor T5 of the second pixel circuit PC2. That is, the operation control thin-film transistor T5 of the first pixel circuit PC1 and the operation control thin-film transistor T5 of the second pixel circuit PC2 may share one driving voltage line 30. Accordingly, the driving voltage line 30 may be electrically connected to the first pixel circuit PC1 located at a side of the driving voltage line 30 and the second pixel circuit PC2 located at the other side of the driving voltage line 30. According to some example embodiments, because the first pixel circuit PC1 and the second pixel circuit PC2 are symmetric with each other based on the virtual second axis AX2, the driving voltage line 30 may supply a voltage to each of the first pixel circuit PC1 and the second pixel circuit PC2 through the same path.

For example, the driving voltage line 30 may be electrically connected to the upper electrodes CE2 through contact holes located in regions in which the driving voltage line 30 overlaps the upper electrodes CE2 of the first and second pixel circuits PC1 and PC2. Also, each of the upper electrodes CE2 may be electrically connected to the operation control thin-film transistor T5 through a connection electrode located on the same layer as the driving voltage line 30 and having an isolated shape. Accordingly, a driving voltage ELVDD may arrive at the organic light-emitting diode OLED by sequentially passing through the upper electrode CE2, the operation control thin-film transistor T5, the driving thin-film transistor T1, and the emission control thin-film transistor T6 from the driving voltage line 30.

The driving voltage line 30 may include the same material as the driving voltage line 30 according to the embodiments described above. For example, the driving voltage line 30 may include a double-layered structure of a Ti layer/an Al layer, a triple-layered structure of a Ti layer/an Al layer/a Ti layer, etc.

Figure 14:
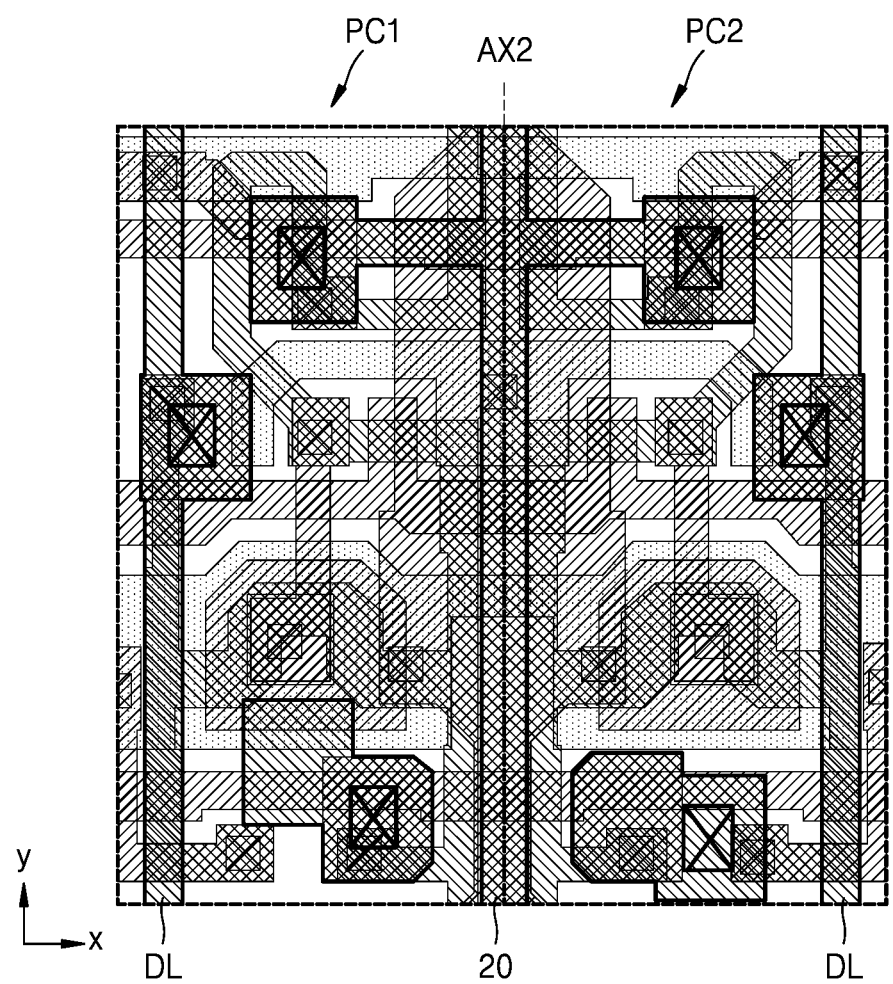

Referring to FIG. 14, the second interlayer insulating layer 109 may be located on a structure of FIG. 13, and the second initialization voltage line 20 and a data line DL may be located on the second interlayer insulating layer 109. Here, the second initialization voltage line 20 and the data line DL may be symmetric with each other based on a virtual second axis AX2.

The second initialization voltage line 20 may extend in a y direction between the first pixel circuit PC1 and the second pixel circuit PC2 and may overlap the driving voltage line 30.

The second initialization voltage line 20 may be located on a layer above the driving voltage line 30, and the driving voltage line 30 may be located on a layer above the first initialization voltage line 10. The first initialization voltage line 10 and the second initialization voltage line 20, which are located on different layers as described above, may be electrically connected to each other through the third connection electrode 60 located on a layer between the first initialization voltage line 10 and the second initialization voltage line 20.

Figure 15:
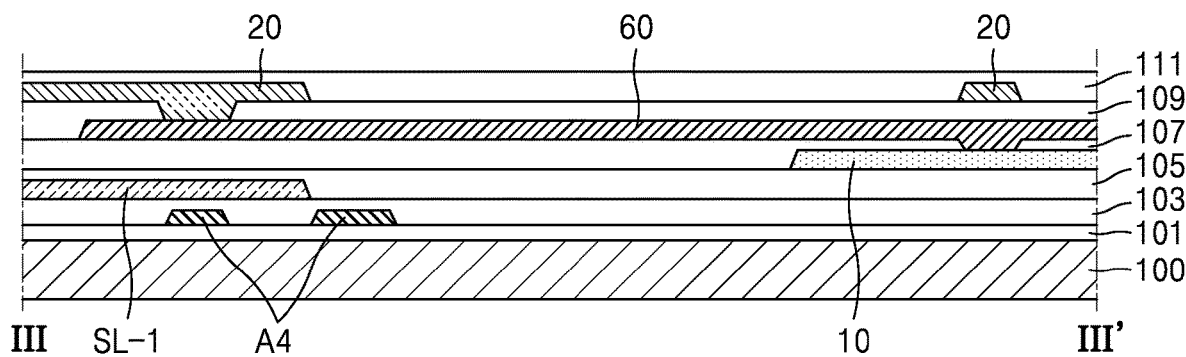
FIG. 15 is a cross-sectional view of the display apparatus of FIG. 10, taken along the line III-III' of FIG. 10.

The third connection electrode 60 will be described in more detail with reference to FIG. 15. FIG. 15 is a cross-sectional view of the display apparatus of FIG. 10, taken along the line III-III' of FIG. 10.

The third connection electrode 60 may be located on a layer between a layer on which the first initialization voltage line 10 is located and a layer on which the second initialization voltage line 20 is located. An end of the third connection electrode 60 may be electrically connected to the second initialization voltage line 20 and the other end of the third connection electrode 60 may be electrically connected to the first initialization voltage line 10. For example, the second initialization voltage line 20 may extend in a direction toward the third connection electrode 60 and may be electrically connected to the third connection electrode 60 through a contact hole located in a region in which the second initialization voltage line 30 overlaps the third connection electrode 60. The third connection electrode 60 may extend from an end to the other end and may be electrically connected to the first initialization voltage line 10 through a contact hole located in a region in which the third connection electrode 60 overlaps the first initialization voltage line 10. Accordingly, the first initialization voltage line 10 and the second initialization voltage line 20 may maintain a constant voltage.

Also, in addition to a contact hole connected to the second initialization voltage line 20 located on a layer above the third connection electrode 60, a contact hole connected to the semiconductor layer of the initialization thin-film transistor T4 located on a layer below the third connection electrode 60 may be located at an end of the third connection electrode 60. Thus, the initialization thin-film transistor T4 of the first pixel circuit PC1 and the initialization thin-film transistor T4 of the second pixel circuit PC2 may receive an initialization voltage Vint from the first initialization voltage line 10 or the second initialization voltage line 20 through the third connection electrode 60.

Figure 16:
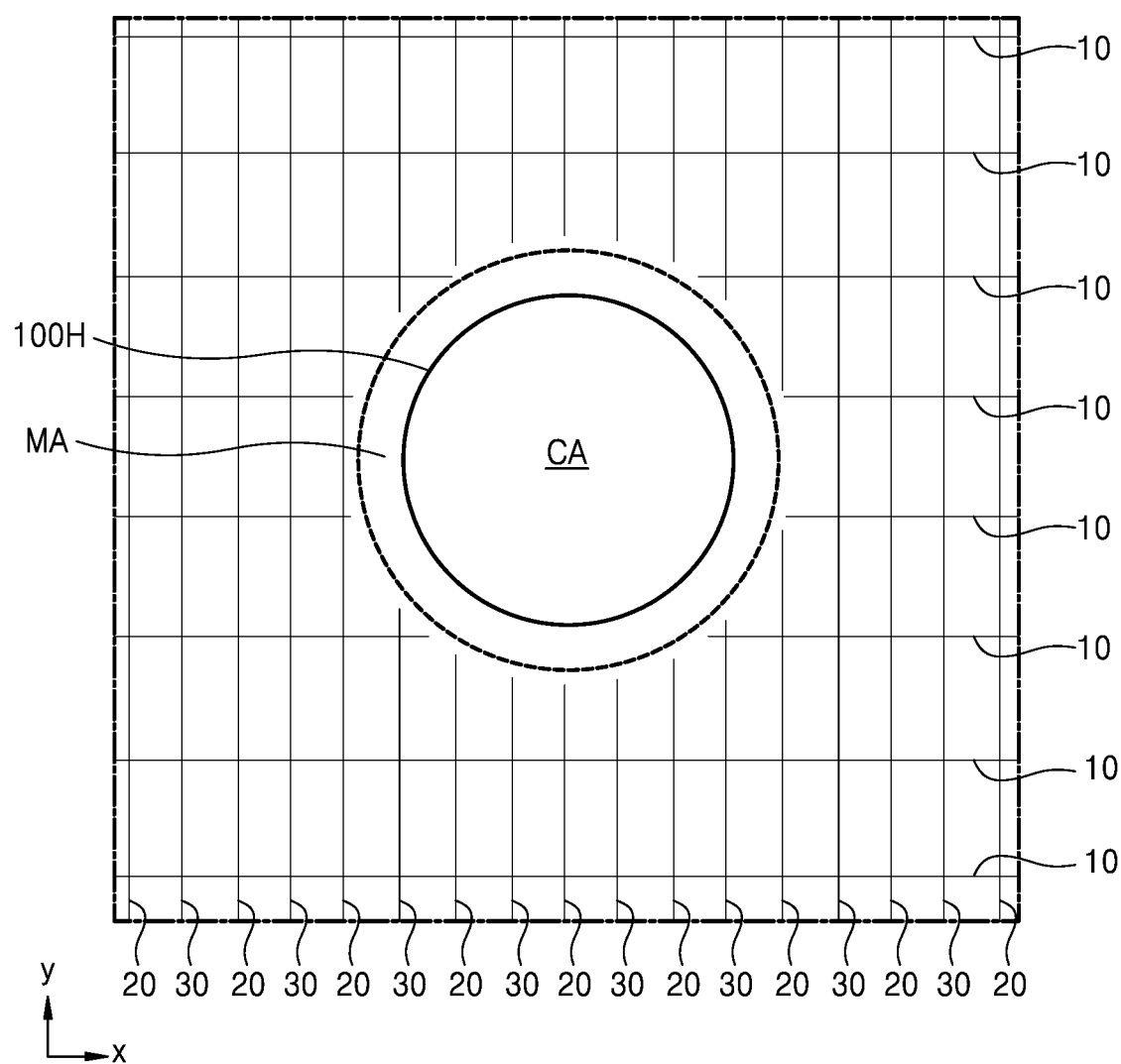
FIG. 16 is a schematic plan view of a structure around a component area (CA) according to some example embodiments.
Figure 17A:
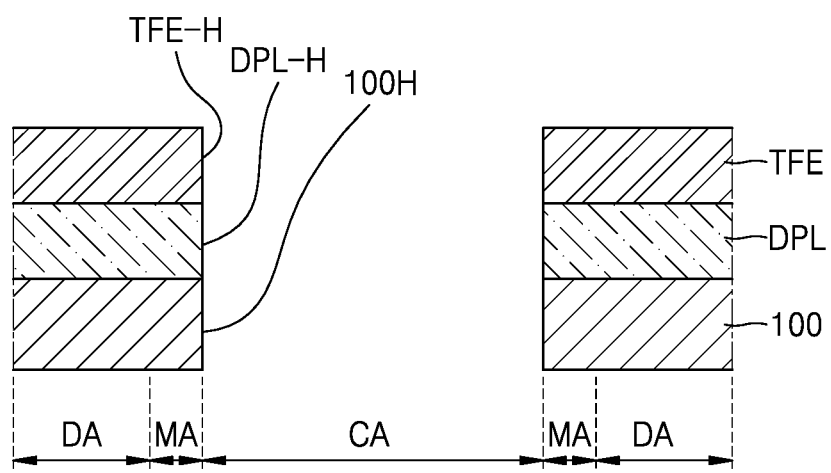
FIGS. 17A and 17B are schematic cross-sectional views of a portion of a display apparatus according to some example embodiments.
Figure 17B:
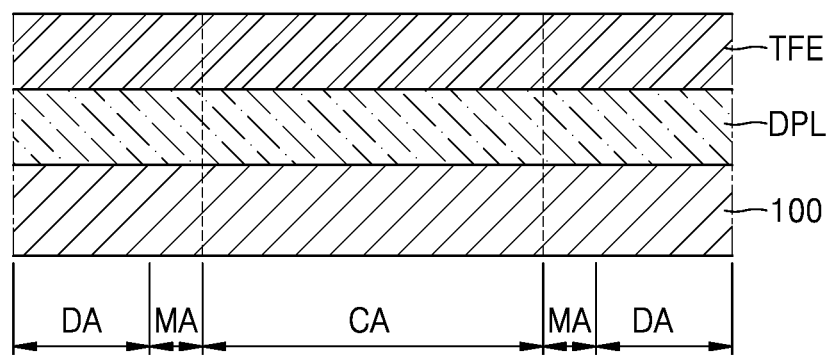

FIG. 16 is a schematic plan view of a structure around the component area CA and FIGS. 17A and 17B are cross-sectional views of a portion of a display apparatus according to some example embodiments. FIG. 16 illustrates the first initialization voltage line 10, the second initialization voltage line 20, and the driving voltage line 30 on the substrate 100, as the structure around the component area CA.

FIG. 16 illustrates an example in which the first pixel circuit PC1 and the second pixel circuit PC2 located to be adjacent to each other are asymmetric with each other according to some example embodiments. However, embodiments according to the present disclosure are not limited thereto. That is, the present embodiment may be identically applied to the example of the asymmetric structure described above and to an example of a symmetric structure. Also, the aspects described above may be applied to the present embodiment, and some of the same aspects will not be repetitively described.

In the display apparatus 1 (FIG. 1) including the component area CA included in the display area DA, when the component area CA is biased toward a side of the display area DA, rather being located in the center of the display area DA, overcharging may occur due to the initialization voltage lines VL connected in parallel with respect to pixels located in a region in which a distance from the component area CA to an edge of the display area DA is great, and thus, a brightness difference may occur. According to some example embodiments, the problem described above may be solved based on a structure including the first initialization voltage lines 10 connected in parallel and the second initialization voltage lines 20 electrically connected to the first initialization voltage lines 10. Thus, high quality image may be provided regardless of a location of the component area CA in the display area DA.

As illustrated in FIG. 16, the first initialization voltage lines 10 may extend in a first direction (for example, an x direction) throughout the plurality of pixel circuits PC and may be electrically connected to the pixel circuits PC located in a row direction. Also, the second initialization voltage lines 20 and the driving voltage lines 30 may extend in a second direction (for example, a y direction) throughout the plurality of pixel circuits PCs and may be alternately electrically connected to the pixel circuits PCs located in a column direction. Here, the first initialization voltage line 10, the second initialization voltage line 20, and/or the driving voltage line 30 may be disconnected around the component area CA.

According to some example embodiments, the substrate 100 of the display apparatus 1 may include a hole 100H located in the component area CA. For example, as illustrated in FIG. 17A, the display apparatus 1 may include the substrate 100, a display layer DPL located on the substrate 100 and including the pixel circuits PCs and the light-emitting diodes described above, and a thin-film encapsulation layer TFE on the display layer DPL, wherein the substrate 100, the display layer DPL, and the thin-film encapsulation layer TFE may respectively include holes 100H, DPL-H, and TFE-H corresponding to the component area CA. According to some example embodiments, the substrate 100, the display layer DPL, and the thin-film encapsulation layer TFE may not include holes corresponding to the component area CA as illustrated in FIG. 17.

A middle area MA may be located between the component area CA and the display area DA. The middle area MA may be a non-display area not emitting light and lines and internal circuits bypassing the component area CA may be located in the middle area MA.

The descriptions above are mainly given with respect to a display apparatus. However, the disclosure is not limited thereto. That is, a method of manufacturing the display apparatus may also be included in the scope of the disclosure.

According to the one or more of the embodiments described above, a display apparatus capable of realizing a high quality image as well as improving a brightness difference may be provided. However, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display apparatus comprising:
a substrate having a display area and a non-display area outside the display area, the display area being an area in which light is emitted;
a first pixel circuit in the display area and including a first driving thin-film transistor and a first storage capacitor electrically connected to the first driving thin-film transistor;
a second pixel circuit adjacent to the first pixel circuit and including a second driving thin-film transistor and a second storage capacitor electrically connected to the second driving thin-film transistor;
a first initialization voltage line electrically connected to the first pixel circuit and the second pixel circuit and extending in a first direction;
a second initialization voltage line electrically connected to the first initialization voltage line and extending in a second direction crossing the first direction and crossing over the first initialization voltage line in the display area to form a mesh structure, the mesh structure overlapping the area in which light is emitted when viewed in a plan view; and
a driving voltage line extending in the second direction between the first pixel circuit and the second pixel circuit,
wherein a channel area of the first driving thin-film transistor in the first pixel circuit in the display area of the substrate or a channel area of the second driving thin-film transistor in the second pixel circuit in the display area of the substrate is between the second initialization voltage line and the driving voltage line when viewing the substrate in the plan view.

2. The display apparatus of claim 1, wherein the first pixel circuit includes a first operation control thin-film transistor electrically connected to the driving voltage line,
the second pixel circuit includes a second operation control thin-film transistor electrically connected to the driving voltage line, and
the first operation control thin-film transistor and the second operation control thin-film transistor are asymmetric with respect to a virtual axis crossing between the first pixel circuit and the second pixel circuit.

3. The display apparatus of claim 2, wherein a semiconductor layer of the first operation control thin-film transistor is electrically connected to the driving voltage line through a first connection electrode.

4. The display apparatus of claim 3, wherein the first connection electrode includes:
a 1-1$^{st}$ connection electrode corresponding to a portion of any one of electrodes of the first storage capacitor and contacting the driving voltage line; and
a 1-2$^{nd}$ connection electrode contacting the 1-1$^{st}$ connection electrode and the semiconductor layer of the first operation control thin-film transistor.

5. The display apparatus of claim 1, wherein the first pixel circuit includes a first compensation thin-film transistor electrically connected to the first driving thin-film transistor, and
a portion of a semiconductor layer of the first compensation thin-film transistor overlaps a shield electrode electrically connected to the driving voltage line.

6. The display apparatus of claim 5, wherein the second pixel circuit includes a second compensation thin-film transistor electrically connected to the second driving thin-film transistor, and
a portion of a semiconductor layer of the second compensation thin-film transistor overlaps a shield electrode electrically connected to the second initialization voltage line.

7. The display apparatus of claim 1, wherein the second initialization voltage line is on the same layer as the driving voltage line.

8. The display apparatus of claim 1, wherein the second initialization voltage line is on a layer above the first initialization voltage line.

9. The display apparatus of claim 8, wherein the second initialization voltage line is electrically connected to the first initialization voltage line through a second connection electrode being integral with the second initialization voltage line.

10. The display apparatus of claim 9, wherein the first pixel circuit includes a first initialization thin-film transistor electrically connected to the first initialization voltage line, and the second connection electrode includes:
a 2-1$^{st}$ connection electrode overlapping a portion of the first initialization voltage line and electrically connecting the first initialization voltage line with the second initialization voltage line; and
a 2-2$^{nd}$ connection electrode extending from the 2-1$^{st}$ connection electrode and electrically connecting the first initialization voltage line with a semiconductor layer of the first initialization thin-film transistor.

11. A display apparatus comprising:
a substrate having a display area and a non-display area outside the display area, the display area being an area in which light is emitted;
a first pixel circuit in the display area and including a first driving thin-film transistor and a first storage capacitor electrically connected to the first driving thin-film transistor;
a second pixel circuit adjacent to the first pixel circuit and including a second driving thin-film transistor and a second storage capacitor electrically connected to the second driving thin-film transistor;
a first initialization voltage line electrically connected to the first pixel circuit and the second pixel circuit and extending in a first direction;
a second initialization voltage line electrically connected to the first initialization voltage line and extending in a second direction crossing the first direction and crossing over the first initialization voltage line in the display area to form a mesh structure, the mesh structure overlapping the area in which light is emitted when viewed in a plan view; and
a driving voltage line extending in the second direction between the first pixel circuit and the second pixel circuit,
wherein the second initialization voltage line overlaps the driving voltage line when viewing the substrate in the plan view.

12. The display apparatus of claim 11, wherein the first pixel circuit and the second pixel circuit are symmetric with respect to a virtual axis crossing between the first pixel circuit and the second pixel circuit.

13. The display apparatus of claim 12, wherein the first pixel circuit includes a first compensation thin-film transistor electrically connected to the first driving thin-film transistor, and
the second pixel circuit includes a second compensation thin-film transistor electrically connected to the second driving thin-film transistor, and
a portion of a semiconductor layer of the first compensation thin-film transistor and a portion of a semiconductor layer of the second compensation thin-film transistor overlap a shield electrode electrically connected to the driving voltage line.

14. The display apparatus of claim 12, wherein the driving voltage line is on a layer above the first initialization voltage line, and
the second initialization voltage line is on a layer above the driving voltage line.

15. The display apparatus of claim 14, wherein the first initialization voltage line and the second initialization voltage line are electrically connected to each other through a third connection electrode on a layer between the first initialization voltage line and the second initialization voltage line.

16. A display apparatus comprising:
a substrate having a display area, a component area including a hole, the hole penetrating the substrate and defining boundaries of the component area, and a non-display area outside the display area, the display area being an area in which light is emitted;
a first pixel circuit and a second pixel circuit in the display area adjacent to each other around the hole;
a first initialization voltage line electrically connected to the first pixel circuit and the second pixel circuit and extending in a first direction;
a second initialization voltage line electrically connected to the first initialization voltage line and extending in a second direction crossing the first direction and crossing over the first initialization voltage line in the display area to form a mesh structure, the mesh structure overlapping the area in which light is emitted when viewed in a plan view; and
a driving voltage line extending in the second direction between the first pixel circuit and the second pixel circuit,
wherein at least one of the first initialization voltage line, the second initialization voltage line, or the driving voltage line is disconnected around the hole.

17. The display apparatus of claim 16, wherein the first pixel circuit includes a first operation control thin-film transistor electrically connected to the driving voltage line, the second pixel circuit includes a second operation control thin-film transistor electrically connected to the driving voltage line, and the first operation control thin-film transistor and the second operation control thin-film transistor are asymmetric with respect to the driving voltage line.

18. The display apparatus of claim 17, wherein a semiconductor layer of the first operation control thin-film transistor is electrically connected to the driving voltage line through a first connection electrode, and the first connection electrode includes:

a $1$-$1^{st}$ connection electrode corresponding to a portion of any one of electrodes of a first storage capacitor in the first pixel circuit and contacting the driving voltage line; and a $1$-$2^{nd}$ connection electrode contacting the $1$-$1^{st}$ connection electrode and the semiconductor layer of the first operation control thin-film transistor.

19. The display apparatus of claim 16, wherein the first pixel circuit and the second pixel circuit are symmetric with respect to the driving voltage line.

20. The display apparatus of claim 19, wherein the driving voltage line is on a layer above the first initialization voltage line and the second initialization voltage line is on a layer above the driving voltage line, and the first initialization voltage line and the second initialization voltage line are electrically connected to each other through a third connection electrode located on a layer between the first initialization voltage line and the second initialization voltage line.

* * * * *